United States Patent
Lin et al.

(10) Patent No.: US 9,514,819 B2
(45) Date of Patent: Dec. 6, 2016

(54) PROGRAMMING METHOD, MEMORY STORAGE DEVICE AND MEMORY CONTROLLING CIRCUIT UNIT

(71) Applicant: PHISON ELECTRONICS CORP., Miaoli (TW)

(72) Inventors: Wei Lin, Taipei (TW); Kiang-Giap Lau, Hsinchu County (TW)

(73) Assignee: PHISON ELECTRONICS CORP., Miaoli (TW)

( * ) Notice: Subject to any disclaimer, the term of this patent is extended or adjusted under 35 U.S.C. 154(b) by 98 days.

(21) Appl. No.: 14/529,166

(22) Filed: Oct. 31, 2014

(65) Prior Publication Data

US 2016/0078951 A1     Mar. 17, 2016

(30) Foreign Application Priority Data

Sep. 12, 2014  (TW) .............................. 103131539 A

(51) Int. Cl.
G11C 16/10  (2006.01)
G11C 16/04  (2006.01)
G11C 16/34  (2006.01)

(52) U.S. Cl.
CPC .......... *G11C 16/0483* (2013.01); *G11C 16/10* (2013.01); *G11C 16/3427* (2013.01)

(58) Field of Classification Search
CPC ...... G11C 16/10; G11C 16/12; G11C 16/105
USPC ...................................... 365/185.02, 185.18
See application file for complete search history.

(56) References Cited

U.S. PATENT DOCUMENTS

| 8,645,794 | B1* | 2/2014 | Meir | G11C 16/10 365/185.03 |
| 8,902,652 | B1* | 12/2014 | Huang | G11C 11/5628 365/185.03 |
| 2014/0215121 | A1* | 7/2014 | Ordentlich | G06F 12/0246 711/102 |
| 2015/0170754 | A1* | 6/2015 | Ma | G06F 12/16 711/103 |
| 2016/0078951 | A1* | 3/2016 | Lin | G11C 16/14 365/185.29 |

FOREIGN PATENT DOCUMENTS

| TW | 201419284 | 5/2014 |
| TW | 201430852 | 8/2014 |

OTHER PUBLICATIONS

"Office Action of Taiwan Counterpart Application," issued on Dec. 15, 2015, p. 1-p. 4.
"Office Action of Taiwan Counterpart Application", issued on Mar. 15, 2016, p. 1-p. 8.

* cited by examiner

*Primary Examiner* — Hoai V Ho
*Assistant Examiner* — Jay Radke
(74) *Attorney, Agent, or Firm* — Jianq Chyun IP Office

(57) ABSTRACT

A programming method, a memory storage device and a memory controlling circuit unit are provided. The method includes: receiving a first write command; and selecting a first physical erasing unit and sending a first skipping write command sequence according to the first write command. The first skipping write command sequence instructs to execute a first skipping programming process. The first skipping programming process includes: programming first data into a first word line of the first physical erasing unit; and after the first word line is programmed, skipping a second word line adjacent to the first word line, and programming the first data into a third word line not adjacent to the first word line.

28 Claims, 16 Drawing Sheets

PROGRAMMING METHOD, MEMORY STORAGE DEVICE AND MEMORY CONTROLLING CIRCUIT UNIT

CROSS-REFERENCE TO RELATED APPLICATION

This application claims the priority benefit of Taiwan application serial no. 103131539, filed on Sep. 12, 2014. The entirety of the above-mentioned patent application is hereby incorporated by reference herein and made a part of this specification.

BACKGROUND

1. Technical Field

The invention relates to a memory management method, and more particularly, relates to a programming method, a memory storage device and a memory controlling circuit unit.

2. Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

Generally, a plurality of word lines in the rewritable non-volatile memory module are programmed for storing data. However, if a programming method of the word lines is not properly managed, it is possible that too many error bits may be generated in the stored data.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a programming method, a memory storage device and a memory controlling circuit unit, which are capable of reducing errors generated by programming adjacent word lines.

A programming method for a rewritable non-volatile memory module is provided according to an exemplary embodiment of the invention. The rewritable non-volatile memory module includes a plurality of physical erasing units, and the programming method includes: receiving at least one first write command; and selecting a first physical erasing unit from the physical erasing units and sending a first skipping write command sequence according to the first write command. The first skipping write command sequence instructs to execute a first skipping programming process. The first skipping programming process includes: programming a first word line among a plurality of word lines of the first physical erasing unit according to first data corresponding to the first write command; and after the first word line is programmed, skipping at least one second word line adjacent to the first word line among the word lines of the first physical erasing unit, and programming a third word line not adjacent to the first word line among the word lines of the first physical erasing unit according to the first data.

A memory storage device is provided according to an exemplary embodiment of the invention, and the memory storage device includes a connection interface unit, a rewritable non-volatile memory module and a memory controlling circuit unit. The connection interface unit is configured to couple to a host system. The rewritable non-volatile memory module includes a plurality of physical erasing units. The memory controlling circuit unit is coupled to the connection interface unit and the rewritable non-volatile memory module. The memory controlling circuit unit is configured to receive at least one first write command. The memory controlling circuit unit is further configured to select a first physical erasing unit from the physical erasing units and send a first skipping write command sequence according to the first write command. The first skipping write command sequence instructs to execute a first skipping programming process. The first skipping programming process includes: programming a first word line among a plurality of word lines of the first physical erasing unit according to first data corresponding to the first write command; and after the first word line is programmed, skipping at least one second word line adjacent to the first word line among the word lines of the first physical erasing unit, and programming a third word line not adjacent to the first word line among the word lines of the first physical erasing unit according to the first data.

A memory controlling circuit unit is provided according to an exemplary embodiment of the invention and configured to control a rewritable non-volatile memory module. The rewritable non-volatile memory module includes a plurality of physical erasing units, and the memory controlling circuit unit includes a host interface, a memory interface and a memory management circuit. The host interface is configured to couple to a host system. The memory interface is used for coupling to the rewritable non-volatile memory module. The memory management circuit is coupled to the host interface and the memory interface. The memory management circuit is configured to receive at least one first write command. The memory management circuit is further configured to select a first physical erasing unit from the physical erasing units and send a first skipping write command sequence according to the first write command. The first skipping write command sequence instructs to execute a first skipping programming process. The first skipping programming process includes: programming a first word line among a plurality of word lines of the first physical erasing unit according to first data corresponding to the first write command; and after the first word line is programmed, skipping at least one second word line adjacent to the first word line among the word lines of the first physical erasing unit, and programming a third word line not adjacent to the first word line among the word lines of the first physical erasing unit according to the first data.

A memory storage device is provided according to an exemplary embodiment of the invention, and the memory storage device includes a connection interface unit, a rewritable non-volatile memory module and a memory controlling circuit unit. The connection interface unit is configured to couple to a host system. The rewritable non-volatile memory module includes a plurality of physical erasing units. The memory controlling circuit unit is coupled to the connection interface unit and the rewritable non-volatile memory module. The memory controlling circuit unit uses a first word line among a plurality of word lines of a first physical erasing unit among the physical erasing units to store first data. After the first word line is used, the memory controlling circuit unit continues to use a third word line among the word lines of the first physical erasing unit to store the first data. The first word line is not adjacent to the third word line.

Based on the above, a skipping write command sequence is configured to instruct to execute a skipping programming process. In the skipping programming process, the adjacent word lines are not used for storing data. Accordingly, the errors generated by programming the adjacent word lines may then be reduced.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
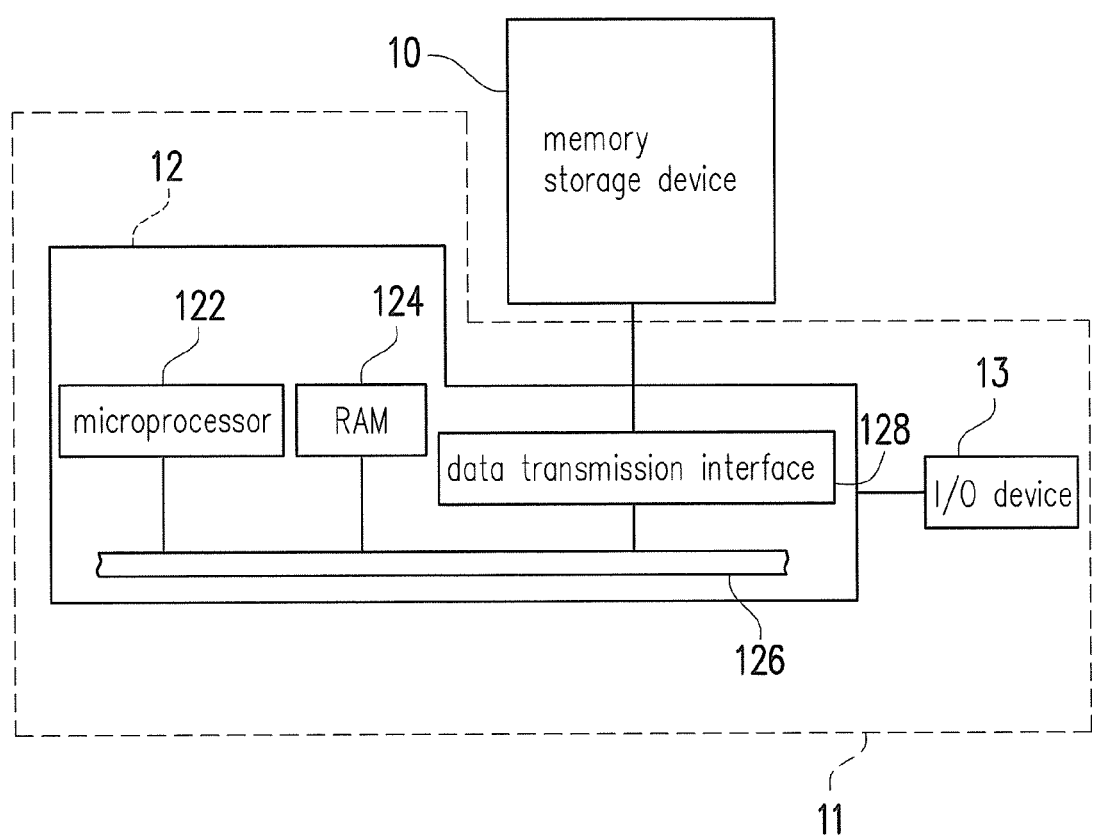
FIG. 1 illustrates a host system and a memory storage device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one," "one or more" and "and/or" are open-ended expressions that are both conjunctive and disjunctive in operation. For example, each of the expressions "at least one of A, B and C," "at least one of A, B, or C," "one or more of A, B, and C," "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also known as a memory storage system) includes a rewritable non-volatile memory module and a controller (also known as a control circuit). The memory storage device is usually configured together with a host system so that the host system may write data to or read data from the memory storage device.

Figure 2:
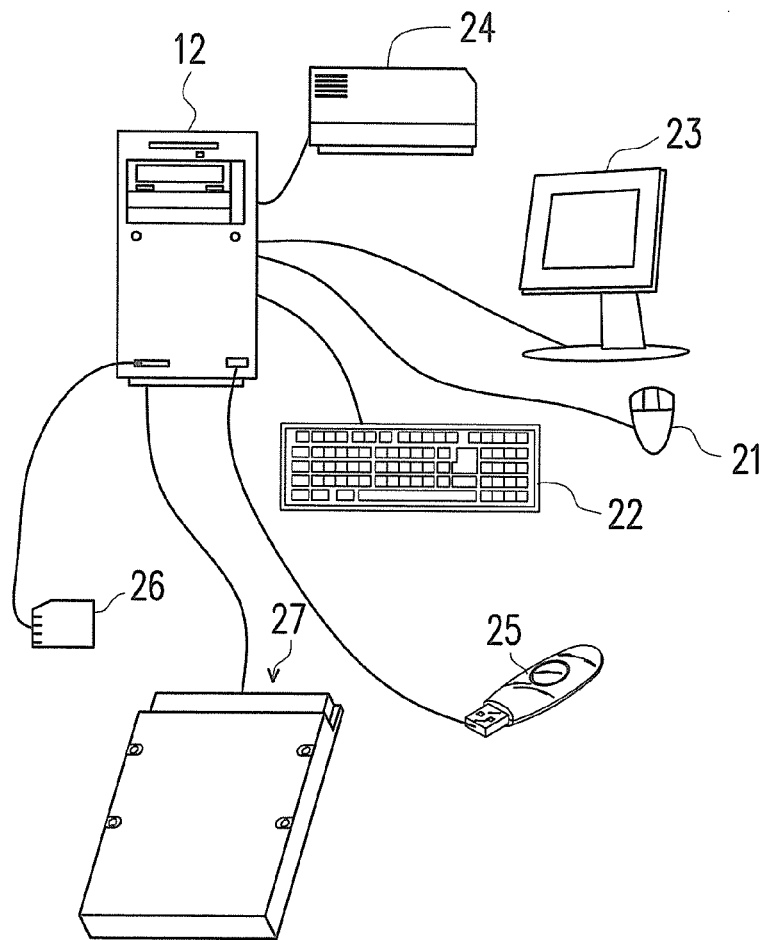
FIG. 2 is a schematic diagram of a computer, an input/output device, and a memory storage device according to an exemplary embodiment of the invention.

FIG. 1 is a schematic diagram illustrating a host system and a memory storage device according to an exemplary embodiment of the invention. FIG. 2 is a schematic diagram of a computer, an input/output device, and a memory storage device according to an exemplary embodiment of the invention.

Referring to FIG. 1, a host system 11 generally includes a computer 12 and an input/output (I/O) device 13. The computer 12 includes a microprocessor 122, a random access memory (RAM) 124, a system bus 126, and a data transmission interface 128. For example, the I/O device 13 includes a mouse 21, a keyboard 22, a display 23 and a printer 24 as shown in FIG. 2. It should be understood that, the devices illustrated in FIG. 2 are not intended to limit the I/O device 13, and the I/O device 13 may further include other devices.

In an exemplary embodiment, the memory storage device 10 is coupled to other devices of the host system 11 through the data transmission interface 128. By using the microprocessor 122, the random access memory 124 and the Input/Output (I/O) device 13, data may be written into the memory storage device 10 or may be read from the memory storage device 10. For example, the memory storage device 10 may be a rewritable non-volatile memory storage device such as a flash drive 25, a memory card 26, or a solid state drive (SSD) 27 as shown in FIG. 2.

Figure 3:
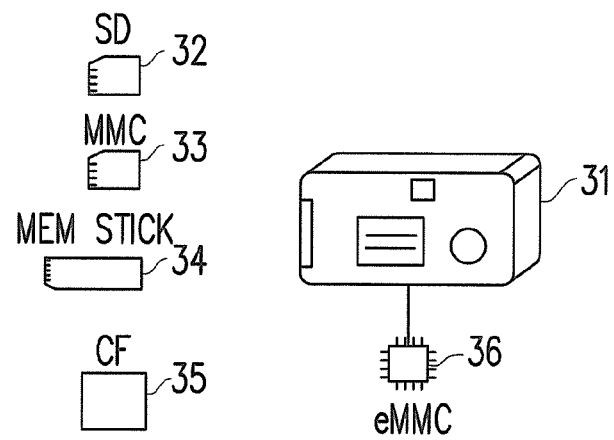
FIG. 3 is a schematic diagram illustrating a host system and a memory storage device according to an exemplary embodiment of the invention.

FIG. 3 is a schematic diagram illustrating a host system and a memory storage device according to an exemplary embodiment of the invention.

Generally, the host system 11 may be any system capable of substantially cooperating with the memory storage device 10 for storing data. In the present exemplary embodiment, the host system 11 is illustrated as a computer system. However, in another exemplary embodiment, the host system 11 may be a system such as a digital camera, a video camera, a telecommunication device, an audio player, or a video player. For example, when the host system is a digital camera (video camera) 31, the rewritable non-volatile memory storage device may be a SD card 32, a MMC card 33, a memory stick 34, a CF card 35 or an embedded storage device 36 (as shown in FIG. 3). The embedded storage device 36 includes an embedded MMC (eMMC). It should be mentioned that the eMMC is directly coupled to a substrate of the host system 11.

Figure 4:
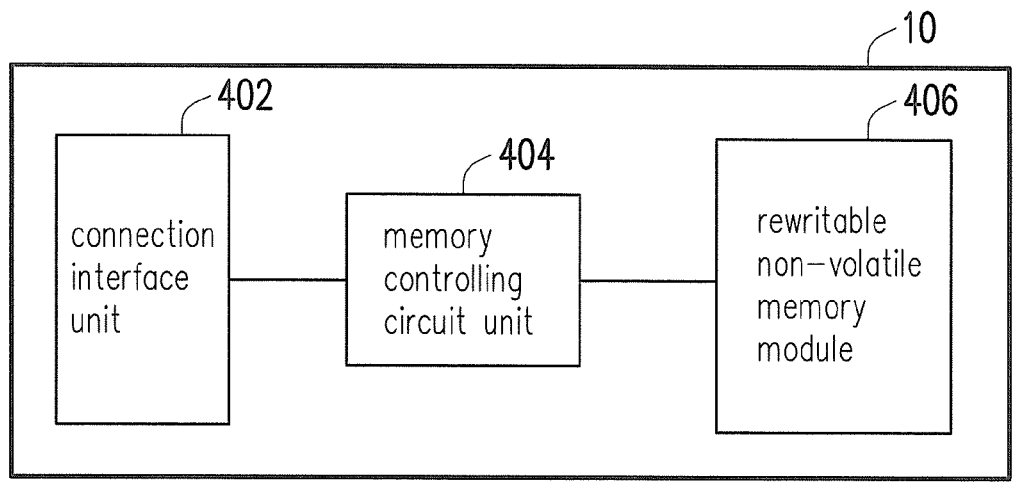
FIG. 4 is a schematic block diagram illustrating the memory storage device depicted in FIG. 1.

FIG. 4 is a schematic block diagram illustrating the memory storage device depicted in FIG. 1.

Referring to FIG. 4, the memory storage device 10 includes a connection interface unit 402, a memory controlling circuit unit 404 and a rewritable non-volatile memory module 406.

In the present exemplary embodiment, the connection interface unit 402 is compatible with a serial advanced technology attachment (SATA) standard. However, the invention is not limited thereto, and the connection interface unit 402 may also be compatible with a Parallel Advanced Technology Attachment (PATA) standard, an Institute of Electrical and Electronic Engineers (IEEE) 1394 standard, a peripheral component interconnect (PCI) Express interface standard, a universal serial bus (USB) standard, a secure digital (SD) interface standard, a Ultra High Speed-I (UHS-I) interface standard, a Ultra High Speed-II (UHS-II) interface standard, a memory sick (MS) interface standard, a multi media card (MMC) interface standard, an embedded MMC (eMMC) interface standard, a Universal Flash Storage (UFS) interface standard, a compact flash (CF) interface standard, an integrated device electronics (IDE) interface standard or other suitable standards. The connection interface unit 402 and the memory controlling circuit unit 404 may be packaged into one chip, or the connection interface unit 402 is distributed outside of a chip containing the memory controlling circuit unit 404.

The memory controlling circuit unit 404 is configured to execute a plurality of logic gates or control commands which are implemented in a hardware form or in a firmware form, so as to execute operations of writing, reading or erasing data in the rewritable non-volatile memory module 406 according to the commands of the host system 11.

The rewritable non-volatile memory module 406 is coupled to the memory controlling circuit unit 404 and configured to store data written from the host system 11. The rewritable non-volatile memory module 406 may be a Single Level Cell (SLC) NAND flash memory module, a Multi Level Cell (MLC) NAND flash memory module (i.e., a flash memory module capable of storing two bits of data in one memory cell), a Triple Level Cell (TLC) NAND flash memory module (i.e., a flash memory module capable of storing three bits of data in one memory cell), other flash memory modules or any memory module having the same features.

Figure 5:
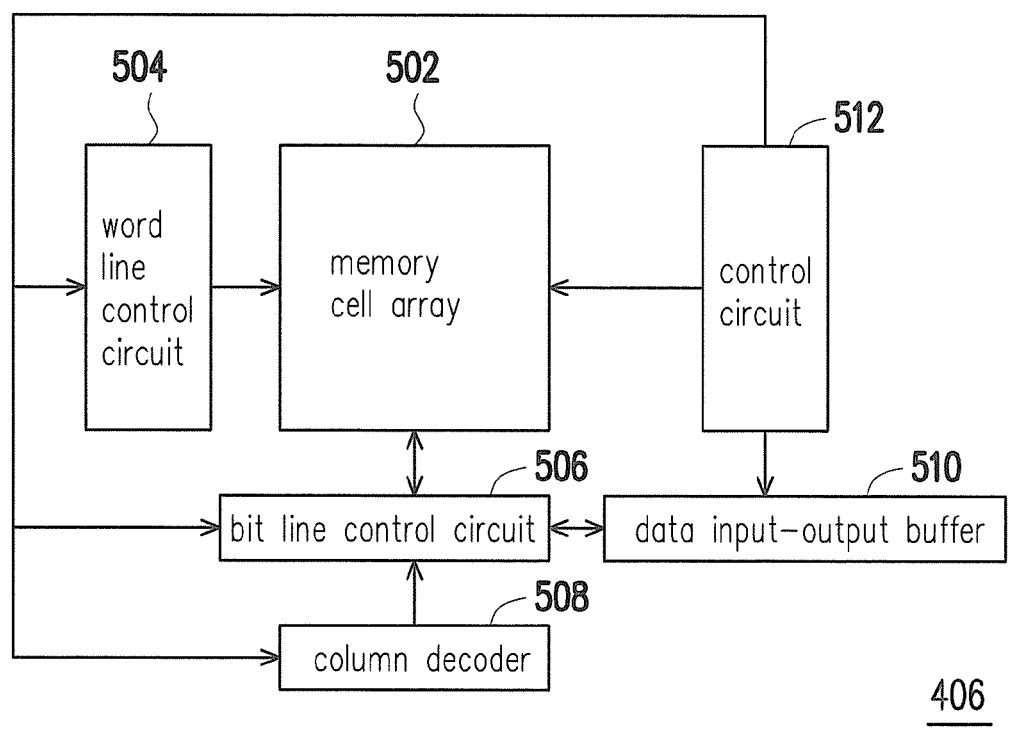
FIG. 5 is a schematic block diagram illustrating a rewritable non-volatile memory module according to an exemplary embodiment of the invention.
Figure 6:
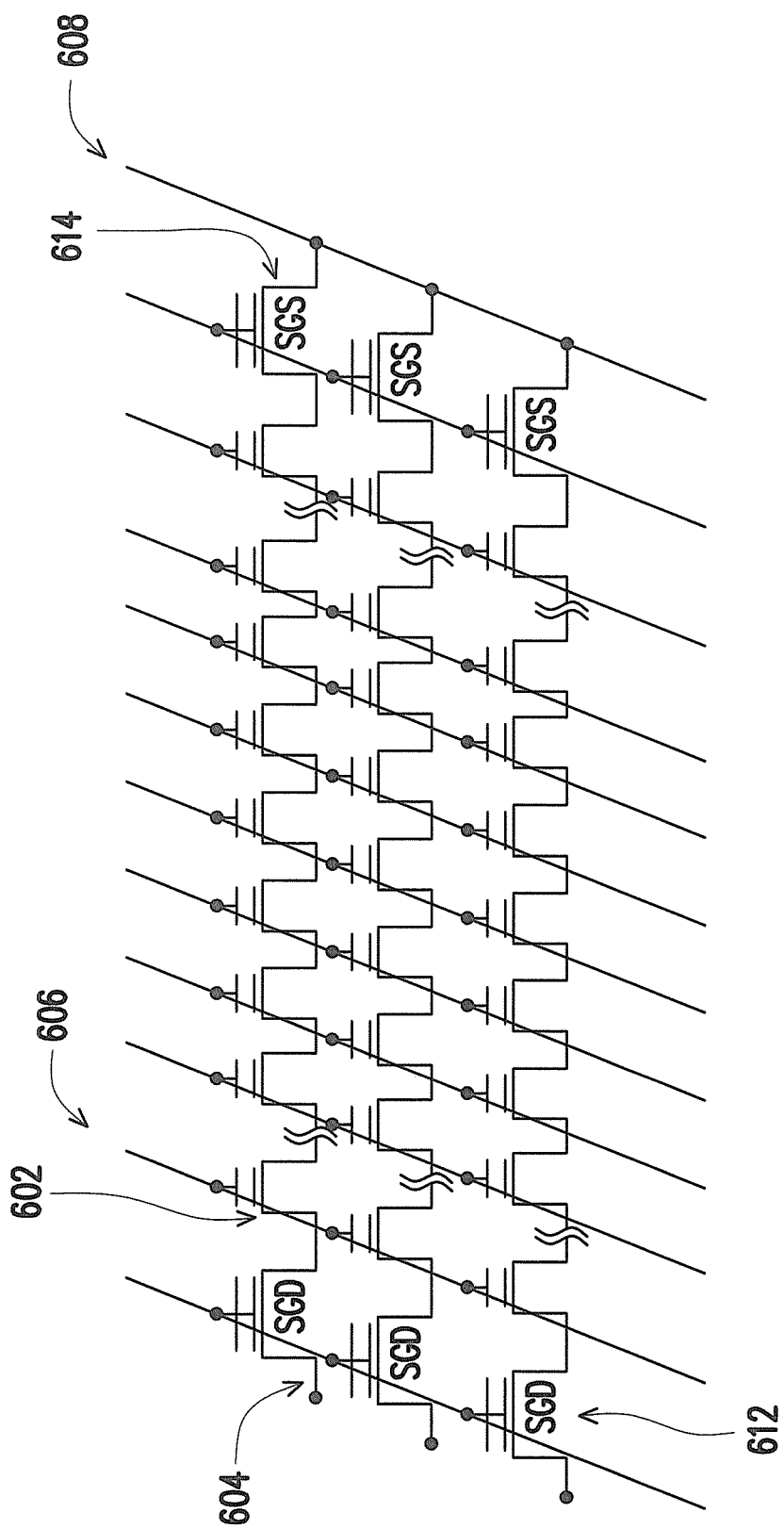
FIG. 6 is a schematic diagram illustrating a memory cell array according to an exemplary embodiment of the invention.

FIG. 5 is a schematic block diagram illustrating a rewritable non-volatile memory module according to an exemplary embodiment of the invention. FIG. 6 is a schematic diagram illustrating a memory cell array according to an exemplary embodiment of the invention.

Referring to FIG. 5, the rewritable non-volatile memory module 406 includes a memory cell array 502, a word line control circuit 504, a bit line control circuit 506, a column decoder 508, a data input-output buffer 510 and a control circuit 512.

In the present exemplary embodiment, the memory cell array 502 may include a plurality of memory cells 602 used to store data, a plurality of select gate drain (SGD) transistors 612, a plurality of select gate source (SGS) transistors 614, as well as a plurality of bit lines 604, a plurality of word lines 606, a common source line 608 connected to the memory cells (as shown in FIG. 6). The memory cell 602 is disposed at intersections of the bit lines 604 and the word lines 606 in a matrix manner (or in a 3D stacking manner). When a write command or a read command is received from the memory controlling circuit unit 404, the control circuit 512 controls the word line control circuit 504, the bit line control circuit 506, the column decoder 508, the data input-output buffer 510 to write the data into the memory cell array 502 or read the data from the memory cell array 502. Among them, the word line control circuit 504 is configured to control voltages applied to the word lines 606; the bit line control circuit 506 is configured to control voltages applied to the bit lines 604; the column decoder 508 is configured to select the corresponding bit line according to a row address in a command; and the data input-output buffer 510 is configured to temporarily store the data.

Each of the memory cells in the rewritable non-volatile memory module 406 may store one or more bits by changing a threshold voltage of the memory cell. More specifically, in each of the memory cells, a charge trapping layer is provided between a control gate and a channel. Amount of electrons in the charge trapping layer may be changed by applying a write voltage to the control gate thereby changing the threshold voltage of the memory cell. This process of changing the threshold voltage is also known as "writing data into the memory cell" or "programming the memory cell." Each of the memory cells in the memory cell array 502 has a plurality of storage statuses depended on changes in the threshold voltage. Moreover, which of the storage statuses that the memory cell belongs to may be determined by read voltages, so as to obtain the one or more bits stored in the memory cell.

Figure 7:
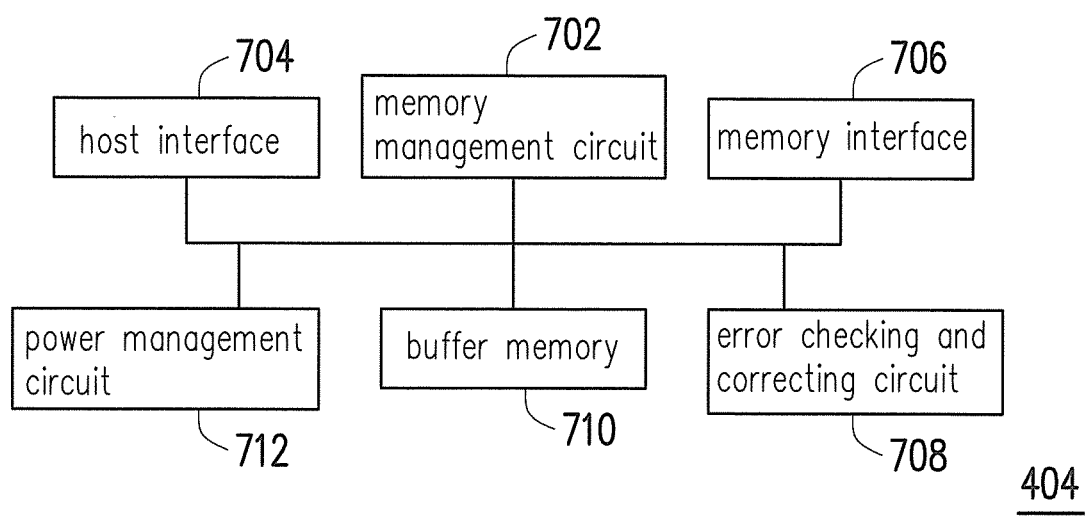
FIG. 7 is a schematic block diagram illustrating a memory controlling circuit unit according to an exemplary embodiment of the invention.

FIG. 7 is a schematic block diagram illustrating a memory controlling circuit unit according to an exemplary embodiment of the invention.

Referring to FIG. 7, the memory controlling circuit unit 404 includes a memory management circuit 702, a host interface 704, a memory interface 706 and an error checking and correcting circuit 708.

The memory management circuit 702 is configured to control overall operations of the memory controlling circuit unit 404. Specifically, the memory management circuit 702 has a plurality of control commands. During operations of the memory storage device 10, the control commands are executed to execute various operations such as writing, reading and erasing data. Operations of the memory management circuit 702 are similar to the operations of the memory controlling circuit unit 404, thus related description is omitted hereinafter.

In the present exemplary embodiment, the control commands of the memory management circuit 702 are implemented in a form of a firmware. For instance, the memory management circuit 702 has a microprocessor unit (not illustrated) and a ROM (not illustrated), and the control commands are burned into the ROM. When the memory storage device 10 operates, the control commands are executed by the microprocessor to perform operations of writing, reading or erasing data.

In another exemplary embodiment, the control commands of the memory management circuit 702 may also be stored as program codes in a specific area (for example, the system area in a memory exclusively used for storing system data) of the rewritable non-volatile memory module 406. In addition, the memory management circuit 702 has a microprocessor unit (not illustrated), a ROM (not illustrated) and a RAM (not illustrated). More particularly, the ROM has a boot code, which is executed by the microprocessor unit to load the control commands stored in the rewritable non-volatile memory module 406 to the RAM of the memory management circuit 702 when the memory controlling circuit unit 404 is enabled. Thereafter, the control commands are executed by the microprocessor unit to perform operations of writing, reading or erasing data.

Further, in another exemplary embodiment, the control commands of the memory management circuit 702 may also be implemented in a form of hardware. For example, the memory management circuit 702 includes a microcontroller, a memory writing unit, a memory reading unit, a memory erasing unit and a data processing unit. The memory management unit, the memory writing unit, the memory reading unit, the memory erasing unit and the data processing unit are coupled to the microprocessor. The memory management unit is configured to manage the physical erasing units of the rewritable non-volatile memory module 406; the memory writing unit is configured to issue a write command to the rewritable non-volatile memory module 406 in order to write data to the rewritable non-volatile memory module 406; the memory reading unit is configured to issue a read command to the rewritable non-volatile memory module 406 in order to read data from the rewritable non-volatile memory module 406; the memory erasing unit is configured to issue an erase command to the rewritable non-volatile memory module 406 in order to erase data from the rewritable non-volatile memory module 406; the data processing unit is configured to process both the data to be written to the rewritable non-volatile memory module 406 and the data to be read from the rewritable non-volatile memory module 406.

The host interface 704 is coupled to the memory management circuit 702 and configured to receive and identify commands and data sent from the host system 11. In other words, the commands and data sent from the host system 11 are passed to the memory management circuit 702 through the host interface 704. In the present exemplary embodiment, the host interface 704 is compatible with a SATA standard. However, it should be understood that the present invention is not limited thereto, and the host interface 704 may also be compatible with a PATA standard, an IEEE 1394 standard, a PCI Express standard, a USB standard, a SD standard, a UHS-I standard, a UHS-II standard, a MS standard, a MMC standard, a eMMC standard, a UFS standard, a CF standard, an IDE standard, or other suitable standards for data transmission.

The memory interface 706 is coupled to the memory management circuit 702 and configured to access the rewritable non-volatile memory module 406. That is, data to be written to the rewritable non-volatile memory module 406 is converted to a format acceptable to the rewritable non-volatile memory module 406 through the memory interface 706. Specifically, if the memory management circuit 702 intends to access the rewritable non-volatile memory module 406, the memory interface 706 sends corresponding command sequences. The command sequences may include one or more signals, or data from the bus. For example, in a read command sequence, information such as identification codes and memory addresses are included.

The error checking and correcting circuit 708 is coupled to the memory management circuit 702 and configured to execute an error checking and correcting process to ensure the correctness of data. Specifically, when the memory management circuit 702 receives the writing command from the host system 11, the error checking and correcting circuit 708 generates an error correcting code (ECC) and/or an error detecting code (EDC) for data corresponding to the writing command, and the memory management circuit 702 writes data and the ECC and/or the EDC corresponding to the writing command to the rewritable non-volatile memory module 406. Subsequently, when the memory management circuit 702 reads the data from the rewritable non-volatile memory module 406, the corresponding ECC and/or the EDC is also read from the rewritable non-volatile memory module 406, and the error checking and correcting circuit 708 executes the error checking and correcting process for the read data based on the ECC and/or the EDC.

In an exemplary embodiment, the memory controlling circuit unit 404 further includes a buffer memory 710 and a power management circuit 712. The buffer memory 710 is coupled to the memory management circuit 702 and configured to temporarily store data and commands from the host system 11 or data from the rewritable non-volatile memory module 406. The power management unit 712 is coupled to the memory management circuit 702 and configured to control a power of the memory storage device 10.

The memory cells of the rewritable non-volatile memory module 406 constitute a plurality of physical programming units, and the physical programming units constitute a plurality of physical erasing units. Specifically, the memory cells on the same word line constitute one or more physical programming units. If each of the memory cells can store more than two bits, the physical programming units on the same word line can be at least classified into a lower physical programming unit and an upper physical programming unit. For instance, a least significant bit (LSB) of one memory cell belongs to the lower physical programming unit, and a most significant bit (MSB) of one memory cell belongs to the upper physical programming unit. Generally, in the MLC NAND flash memory, a writing speed of the lower physical programming unit is faster than a writing speed of the upper physical programming unit, or a reliability of the lower physical programming unit is higher than a reliability of the upper physical programming unit. In the present exemplary embodiment, the physical programming unit is a minimum unit for programming. That is, the physical programming unit is the minimum unit for writing data. For example, the physical programming unit is a physical page or a physical sector. In the embodiment, a rows of cells are programmed through the word line to which the rows of cells is coupled (programming a word line). If the physical programming unit is the physical page, the physical programming unit usually includes a data bit area and a redundancy bit area. The data bit area has multiple physical sectors configured to store user data, and the redundant bit area is configured to store system data (e.g., an error correcting code). In the present exemplary embodiment, the data bit area contains 32 physical sectors, and a size of each physical sector is 512-byte (B). However, in another exemplary embodiments, the data bit area may also include 8, 16, or more or less of the physical sectors, and an amount and a size of the physical sectors are not limited in the invention. On the other hand, the physical erasing unit is the minimal unit for erasing. Namely, each physical erasing unit contains the least number of memory cells to be erased together. For instance, the physical erasing unit is a physical block.

Figure 8:
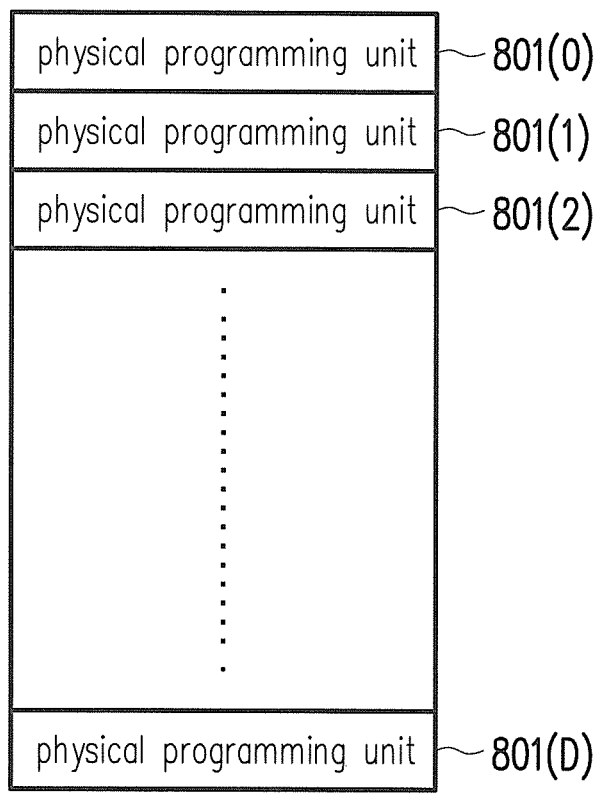
FIG. 8 is a schematic diagram illustrating a rewritable non-volatile memory module according to an exemplary embodiment of the invention.

FIG. 8 is a schematic diagram illustrating a rewritable non-volatile memory module according to an exemplary embodiment of the invention.

Referring to FIG. 8, the rewritable non-volatile memory module 406 includes physical programming units 801(0) to 801(D). In an exemplary embodiment, the memory cells on one word line constitutes one or more physical programming units. For example, the physical programming unit 801(0), the physical programming units 801(0) to 801(1) or the physical programming units 801(0) to 801(2) may be constituted by the memory cells on the same word line of the rewritable non-volatile memory module 406.

Each of the physical programming units in the rewritable non-volatile memory module 406 may be used in a first programming mode or a second programming mode. For example, using one physical programming unit in the first programming mode or the second programming mode means that the physical programming unit is programmed in the first programming mode or the second programming mode. In addition, using one physical erasing unit or the rewritable non-volatile memory module 406 in the first programming mode or the second programming mode means that the physical erasing unit or one or more physical programming units of the rewritable non-volatile memory module 406 are programmed in the first programming mode or the second programming mode.

The first programming mode is also known as a multi level cell mode. If the rewritable non-volatile memory module 406 is used in the first programming mode, bit data of a first amount is stored in each of the memory cells, and the first amount is not less than 2. For example, the first amount is 2 or 3. The second programming mode includes at least one of a SLC mode, a lower physical programming mode, a mixture programming mode and a fewer level cell mode. If the rewritable non-volatile memory module 406 is used in the SLC mode, only one bit data is stored in each of the memory cells. If the rewritable non-volatile memory module 406 is used in the lower physical programming mode, only the physical programming units belonging to the lower physical programming unit in the rewritable non-volatile memory module 406 are programmed, and the upper physical programming unit corresponding to the lower physical programming unit may not be programmed. If the rewritable non-volatile memory module 406 is used in the mixture programming mode, valid data (or real data) are programmed into the physical programming units belonging to the lower physical programming unit without being programmed into the physical programming units belonging to the upper physical programming unit. Yet, invalid data (or dummy data) corresponding to the valid data (or real data) is programmed into the physical programming units belonging to the upper physical programming unit. If the rewritable non-volatile memory module 406 is used in the fewer level cell mode, a second amount of bit data is stored in each of the memory cells, and the second amount is less than the first amount. For example, the second amount is 1 or 2. Particularly, with respect to the physical programming units used in different modes of the second programming mode, distributions of threshold voltages of the memory cells being programmed therein may be different.

Figure 9:
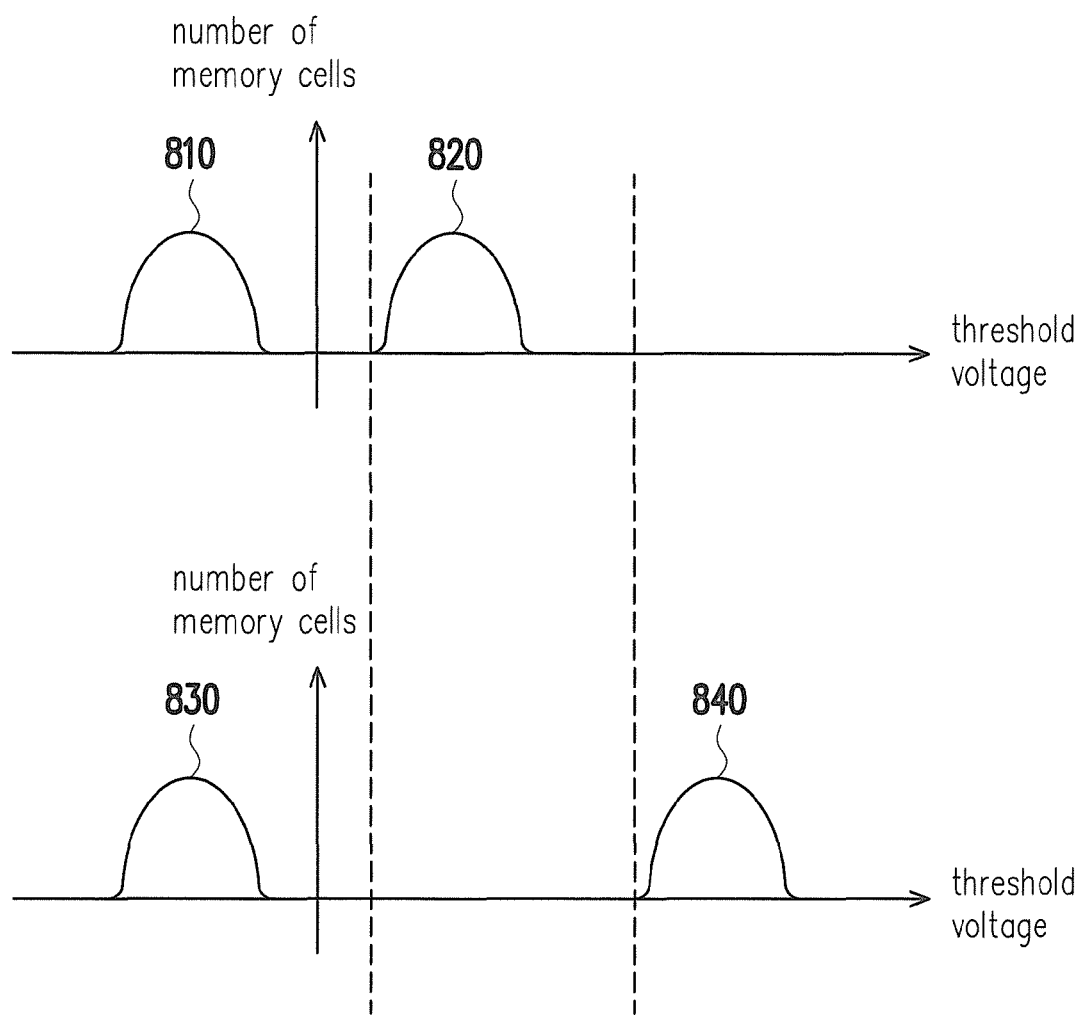
FIG. 9 is a schematic diagram illustrating the distributions of the threshold voltages of the memory cells of the physical programming units programmed with the different modes of the second programming mode according to an exemplary embodiment of the invention.

FIG. 9 is a schematic diagram illustrating the distributions of the threshold voltages of the memory cells of the physical programming units programmed with the different modes of the second programming mode according to an exemplary embodiment of the invention.

Referring to FIG. 9, if a plurality of memory cells of one word line are programmed in the lower physical programming mode of the second programming mode, the distributions of the threshold voltages of these memory cells are similar to distributions 810 and 820. Among them, the distribution 810 indicates, for example, a number of the memory cells storing bit "0" on this word line; and the distribution 820 indicates, for example, a number of the memory cells storing bit "1" on this word line. On the other hand, if a plurality of memory cells of another word line are programmed in the SLC mode of the second programming mode, the distributions of the threshold voltages of these memory cells are similar to distributions 830 and 840. Among them, the distribution 830 indicates, for example, a number of the memory cells storing bit "0" on this word line; and the distribution 840 indicates, for example, a number of the memory cells storing bit "1" on this word line. As compared with the usage of the lower physical programming mode, in the distributions of the threshold voltages of the memory cells used in the SLC mode, the distributions corresponding to different bit values are relatively farther from each other. For example, as shown in FIG. 8, the distributions 810 and 820 are closer to each other, and the distributions 830 and 840 are farther from each other.

Figure 10:
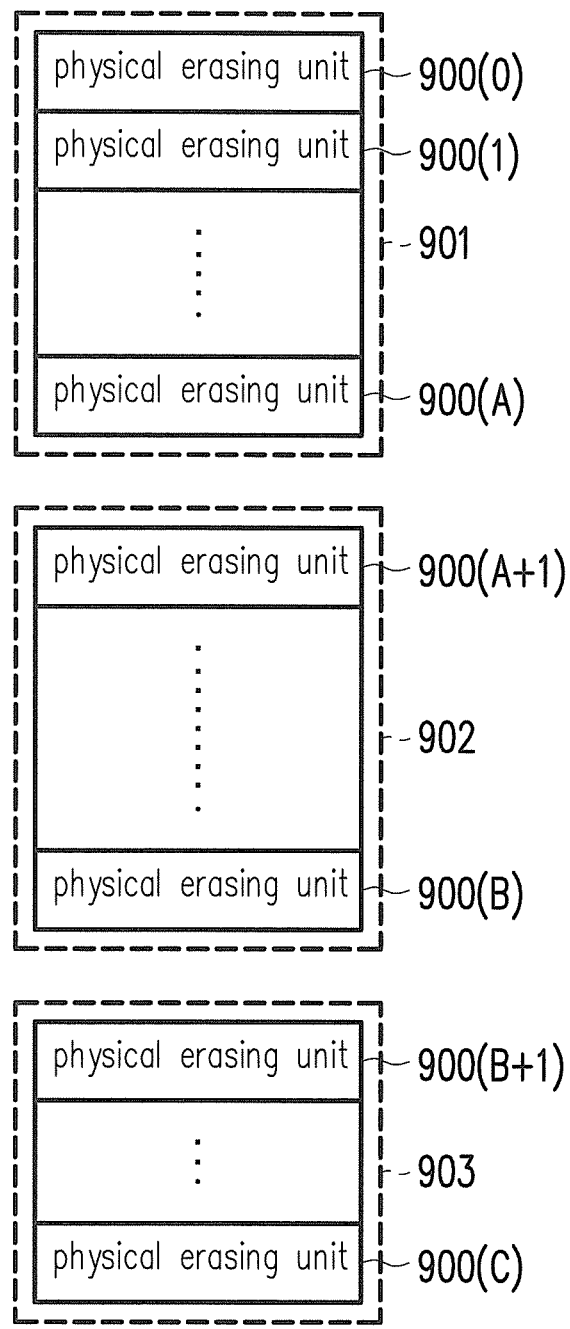
FIG. 10 is a schematic diagram illustrating the management of a rewritable non-volatile memory module according to an exemplary embodiment of the invention.

FIG. 10 is a schematic diagram illustrating the management of a rewritable non-volatile memory module according to an exemplary embodiment of the invention. It should be understood that terms, such as "select," "group," "divide," "associate" and so forth, are logical concepts which describe operations in the physical erasing units of the rewritable non-volatile memory module 406. That is, the physical erasing units of the rewritable non-volatile memory module are logically operated, but actual positions of the physical erasing units of the rewritable non-volatile memory module are not changed.

Referring to FIG. 10, in the present exemplary embodiment, the memory management circuit 702 may logically divide physical erasing units 900(0) to 900(C) of the rewritable non-volatile memory module 406 into a plurality of areas, such as a first storage area 901, a second storage area 902 and a system area 903. Each of the physical erasing units 900(0) to 900(C) includes a plurality of physical programming units.

The physical erasing units in the first storage area 901 and the second storage area 902 are configured to store data from the host system 11. The first storage area 901 and the second storage area 902 store the valid data and the invalid data. For example, when the host system 11 intends to delete one valid data, the data being deleted may still be stored in the second storage area 902 but marked as the invalid data. The physical erasing unit not storing the valid data is also known as a spare physical erasing unit. For example, the physical erasing unit being erased may become the spare physical erasing unit. If there are damaged physical erasing units in the first storage area 901, the second storage area 902 or the system area 903, the physical erasing units in the first storage area 901 or the second storage area 902 may also be used to replace the damaged physical erasing units. If there are no available physical erase units in the first storage area 901 and/or the second storage area 902 for replacing the damaged physical erasing units, the memory management circuit 702 can announce that the memory storage device 10 is in a write protect status, so that data can no longer be written therein. In addition, the physical erasing unit storing the valid data is also known as a non-spare physical erasing unit.

The physical erasing units in the system area 903 are configured to record system information including information related to manufacturer and model of a memory chip, a number of physical erasing units in the memory chip, a number of the physical programming unit in each physical erasing unit, and so forth.

Amounts of the physical erasing units in the first storage area 901, the second storage area 902 and the system area 903 may be different based on the different memory specifications. In addition, it should be understood that, during the operation of the memory storage device 10, grouping relations of the physical erasing units related to the first storage area 901, the second storage area 902 and the system area 903 may be dynamically changed. For example, when the damaged physical erasing units in the system area 903 are replaced by the physical erasing units in the second storage area 902, the physical erasing units originally in the second storage area 902 are then associated to the system area 903.

In the present exemplary embodiment, the first storage area 901 is configured to temporarily store the data from the host system 11. For example, the first storage area 901 is also known as a temporary storage area or a buffer area. When the rewritable non-volatile memory module 406 receives one data from the memory controlling circuit unit 404, said data is first temporarily stored into one or more physical erasing units of the first storage area 901. Later, the data temporarily stored in the first storage area 901 is copied into one or more physical erasing units of the second storage area 902. After the data of one specific physical erasing unit in the first storage area 901 is copied into the physical erasing unit(s) of the second storage area 902, the specific physical erasing unit in the first storage area 901 is erased. However, in another exemplary embodiment, it is also possible that the first storage area 901 may not be disposed by the memory management circuit 702, or the first storage area 901 may be disposed in the buffer memory 710.

In the present exemplary embodiment, the second programming mode is used only in the first storage area 901. For example, all of the physical erasing units 900(0) to 900(A) in the first storage area 901 are used (e.g., to write data) in the second programming mode while the physical erasing units 900(A+1) to 900(B) in the second storage area 902 are used (e.g., to write data) in the first programming mode. Accordingly, even though a data writing speed of the second storage area 902 is slower, the data can still be temporarily stored into the first storage area 901 quickly, so as to increase the overall data writing speed. In another exemplary embodiment, the second programming mode is used only in the second storage area 902. For example, all of the physical erasing units 900(0) to 900(A) in the first storage area 901 are used (e.g., to write data) in the first programming mode while the physical erasing units 900(A+1) to 900(B) in the second storage area 902 are used (e.g., to write data) in the second programming mode. Moreover, in another exemplary embodiment, the second programming mode can also be simultaneously used in both the first storage area 901 and the second storage area 902. Alternatively, in another exemplary embodiment, the first programming mode can also be simultaneously used in both the first storage area 901 and the second storage area 902. One of the first programming mode and the second programming mode can also be used in the system area 903. Further, the memory management circuit 702 accesses the data in the memory storage device 10 according to one or more logical to physical mapping tables.

Generally, a usage level (or known as a deterioration level) of the physical erasing units 900(0) to 900(A) in the first storage area 901 is relatively higher than a usage level of the physical erasing units 900(A+1) to 900(B) in the second storage area 902. For example, it is assumed that all of the physical erasing units 900(0) to 900(A) in the first storage area 901 are used in the second programming mode (e.g., one memory cell stores one bit) and all of the physical erasing units 900(A+1) to 900(B) in the second storage area 902 are used in the first programming mode (e.g., one memory cell stores 3 bits). In this case, with respect to a specific data which is capable of filling one physical erasing unit (e.g., the physical erasing unit 900(A+1)) in the second storage area 902, a plurality of physical erasing units (e.g., the physical erasing units 900(0), 900(1) and 900(2)) in the first storage area 901 may be used to temporarily store that specific data.

The usage level of one physical erasing unit relates to at least one of an erasing count, a writing count, a reading count and a data storage duration of that physical erasing unit, but the invention is not limited thereto. For example, the usage level of one physical erasing unit may also relate to factors, such as a data type of data stored in the physical erasing unit, a property of the physical erasing unit, an environmental temperature, and so on. In the present exemplary embodiment, the usage level of one physical erasing unit is, for example, represented by the erasing count of that physical erasing unit. However, in another exemplary embodiment, the usage level of one physical erasing unit may also be represented by any one of aforesaid parameters related to the usage level of that physical erasing unit or may be obtained by performing a logical operation on at least one of aforesaid parameters. Moreover, in an exemplary embodiment, the usage level of the physical erasing units 900(0) to 900(A) in the first storage area 901 may also be represented by an average, a weighted average or a median of the usage levels of the physical erasing units 900(0) to 900(A).

When the usage level of one physical erasing unit is higher, it indicates that the reliability of that physical erasing unit may drop while a bit error rate (BER) of that physical erasing unit may rise. Particularly, while programming the memory cells, if each of the word lines on the physical erasing unit is programmed in sequence, an interference may occur between adjacent word lines of that physical erasing unit during programming. For example, such interference is referred as a cell to cell interference. Particularly, for one physical erasing unit with very high usage level, a severity level of the cell to cell interference generated during programming may become a key factor which affects whether the data stored in that physical erasing unit can be decoded successfully. For example, assuming that the data stored in one word line of one physical erasing unit at least includes 8 error bits, and after the cell to cell interference is added thereto, the error bits included in that data may be increased to at least 13. In this case, if a number of the error bits that can be corrected by the error checking and correcting circuit 708 is 12 at the most, it is possible that the error bits in that data cannot be corrected. On the contrary, if occurrences of the cell to cell interference can be effectively reduced, even if there are additional 4 error bits in that data (i.e., a total of 8+4=12 error bits), the data can still be decoded by the error checking and correcting circuit 708 successfully. Alternatively, even that whether one data can be successfully decoded is unrelated to the cell to cell interference, reduction of the cell to cell interference in one physical erasing unit can also reduce the bit error rate of that physical erasing unit.

In the present exemplary embodiment, the memory management circuit 702 may receive one or more write commands (also known as a first write command) from the host system 11. Said first write command instruct to write one or more data (collectively known as first data) into the rewritable non-volatile memory module 406. The first data may include sequential data and/or non-sequential data. The sequential data may belong to the same write command from the host system 11, and the non-sequential data may belong to a plurality of write commands from the host system 11, which are not particularly limited in the invention. According to the first write command, the memory management circuit 702 selects one physical erasing unit (also known as a first physical erasing unit) from the first storage area 901 and sends a skipping write command sequence (also known as a first skipping write command sequence) to the rewritable non-volatile memory module 406. The first skipping write command sequence includes one or more instruction codes or program codes. The first skipping write command sequence instructs the rewritable non-volatile memory module 406 to execute a skipping programming process (also known as a first skipping programming process). In the first skipping programming process, according to the first data, a word line (also known as a first word line) among a plurality of word lines of the first physical erasing unit is the first to be programmed. Then, a word line (also known as a second word line) adjacent to the first word line of the first physical erasing unit is skipped, and another word line (also known as a third word line) not adjacent to the first word line of the first physical erasing unit is programmed according to the first data. And the rest may be arrived at by deduction. In other words, in the first skipping programming process, the rewritable non-volatile memory module 406 programs the selected first physical erasing unit in a manner of skipping the adjacent word lines. Accordingly, the cell to cell interference in the first physical erasing unit may be effectively reduced.

Figure 11:
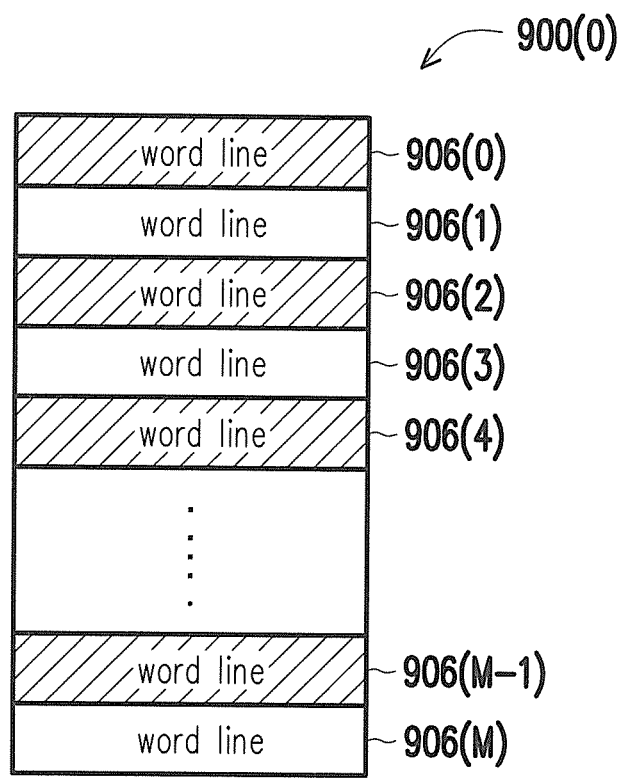
FIG. 11 is a schematic diagram of programming according to an exemplary embodiment of the invention.

FIG. 11 is a schematic diagram of programming according to another exemplary embodiment of the invention. In the following exemplary embodiments, the programmed word lines are marked in slash lines.

Referring to FIG. 11, it is assumed that the physical erasing unit 900(0) is selected, and the physical erasing unit 900(0) includes a plurality of word lines 906(0) to 906(M). The word lines 906(0) to 906(M) are arranged in sequence, and two word lines with marked number differ by 1 are adjacent with each other. For example, the word line 906(0) is adjacent to the word line 906(1); the word line 906(1) is adjacent to the word line 906(2); the word line 906(2) is adjacent to the word line 906(3); and the rest may be deduced by analogy. In the first skipping programming process, a plurality of word lines not adjacent to one another among the word lines 906(0) to 906(M) are programmed in order to store the first data. A number of the programmed word lines is depended upon a data size of the first data. For example, in the present exemplary embodiment, when a (M+1)/2 number of word lines are required for temporarily storing the first data and the physical erasing unit 900(0) is erased in advance, the word line 906(0) is the first to be programmed. Then, the word line 906(1) adjacent to the word line 906(0) is skipped, and the word line 906(2) not adjacent to the word line 906(0) is programmed instead. Thereafter, the word lines 906(3), 906(5) . . . , 906(M−2) and 906(M) are sequentially skipped, and the word lines 906(4), 906(6) . . . , 906(M−3) and 906(M−1) are sequentially programmed. In other words, in the present exemplary embodiment, a part of the first data (or one data in the first data) is programmed into the memory cells on the word line 906(0). Then, after the word line 906(1) adjacent to the word line 906(0) is skipped, another part of the first data (or another data in the first data) is programmed into the memory cell on the word line 906(2). Thereafter, the word line 906(3) is skipped, and other parts of the first data (or the data in the first data which are not yet stored) are sequentially programmed into the word lines of the physical erasing unit 900(0) not adjacent with each other.

It is worth mentioning that, in the first skipping programming process, the programmed one or more word lines may be used to store the data corresponding to the same one or different ones of the write commands from the host system 11. For example, in an exemplary embodiment, if the host system 11 sends only one write command, it is possible that only the first word line being programmed is enough for storing the data corresponding to the write command in the corresponding first skipping programming process. Alternatively, it is also possible that a plurality of word lines are programmed in order to fully store the data corresponding to that write command. However, in another exemplary embodiment, if the host system 11 continues to send one or more write commands, the data corresponding said one or more write commands is tried to be programmed into the first word line in the corresponding first skipping programming process. Then, after the memory cells on the first word line are fully written, the other word lines not adjacent with each other will be programmed in order to store the data which is not yet written.

From another perspective, in the exemplary embodiment of FIG. 11, it is assumed that a $N^{th}$ word line among the word lines 906(0) to 906(M) is the first to be programmed. Then, after the $(N)^{th}$ word line is programmed, a $(N+1)^{th}$ word line among the word lines 906(0) to 906(M) is skipped, and a $(N+2)^{th}$ word line among the word lines 906(0) to 906(M) is programmed. After the $(N+2)^{th}$ word line is programmed, a $(N+3)^{th}$ word line among the word lines 906(0) to 906(M) is skipped, and a $(N+4)^{th}$ word line among the word lines 906(0) to 906(M) is programmed. And the rest may be arrived at by deduction.

It is worth mentioning that, although the exemplary embodiment of FIG. 11 takes an assumption in which the data size of the first data is equal to or less than a size of a total storage space of the memory cells on the (M+1)/2 number of word lines, the data size of the first data may also be greater or smaller in another exemplary embodiment. For example, in another exemplary embodiment of FIG. 11, if only the memory cells on three word lines are enough for storing the first data, it is possible that only three word lines not adjacent to one another are programmed in the first skipping programming process. The three word lines not adjacent to one another may be selected according to a preset rule (e.g., the word lines 906(0), 906(2) and 906(4)), or may be selected randomly (the word lines 906(0), 906(4) and 906(32)). Besides, it is also possible that the word line 906(0) is not the first to be programmed in the first skipping programming process. For example, in another exemplary embodiment of FIG. 11, the word line 906(2) is the first to be programmed before sequentially programming the word line 906(4) and the word line 906(6). Alternatively, in another exemplary embodiment of FIG. 11, it is also possible that the word line 906(0) is skipped and the word line 906(1) is the first to be programmed, and followed by sequentially skipping the word line 906(2) and the word line 906(4) and sequentially programming the word line 906(3) and the word line 906(5), and so forth.

In the present exemplary embodiment, the memory management circuit 702 may further determine whether the data size of the first data exceeds an available size of the first physical erasing unit. In an exemplary embodiment, the available size of the first physical erasing unit is equal to 1/P a size of a total storage space of the first physical erasing unit, and P is an integer greater than 1. For example, if the first physical erasing unit is erased before writing the first data and it is preset to program the first physical erasing unit by a skipping rule identical or similar to that used in the exemplary embodiment of FIG. 11, the available size of the first physical erasing unit is equal to ½ (i.e., P=2) the size of the total storage space of the first physical erasing unit. Further, in another exemplary embodiment of FIG. 11, before writing the first data, the word lines 906(0), 906(2) and 906(4) are programmed and the physical erasing unit 900(0) is not erased. In this case, the word line 906(6) may be the first to be programmed for the first data, and the available size of the first physical erasing unit is a total storage space of the memory cells on the preset and available word lines excluding the word lines 906(0), 906(2) and 906(4) among the word lines 906(0) to 906(M) (i.e., the word lines 906(6), 906(8), . . . , 906(M−3) and 906(M−1)). In other words, the available size of the first physical erasing unit in this case is less than 1/P the size of the total storage space of the first physical erasing unit.

If the data size of the first data does not exceed the available size of the first physical erasing unit, it is not required for the memory management circuit 702 to select additional physical erasing units as to assist in storing the first data. If the data size of the first data exceeds the available size of the first physical erasing unit, the memory management circuit 702 selects additional one or more physical erasing units (also known as a second physical erasing unit) from the first storage area 901. Amount of the second physical erasing unit is depended upon a size of the data to be stored. Accordingly, in the first skipping programming process, the rewritable non-volatile memory module 406 can program the selected first physical erasing unit and the second physical erasing unit in the manner of skipping the adjacent word lines. For example, in the first skipping programming process, another part of the first data (or another data in the first data) is programmed into a word line (also known as a fourth word line) among a plurality of word lines of the second physical erasing unit. After the fourth word line is programmed, a word line (also known as a fifth word line) adjacent to the fourth word line of the second physical erasing unit is skipped, and another part of the first data (or another data in the first data) is programmed into another word line (also known as a sixth word line) not adjacent to the fourth word line of the second physical erasing unit. And the rest may be arrived at by deduction.

Figure 12:
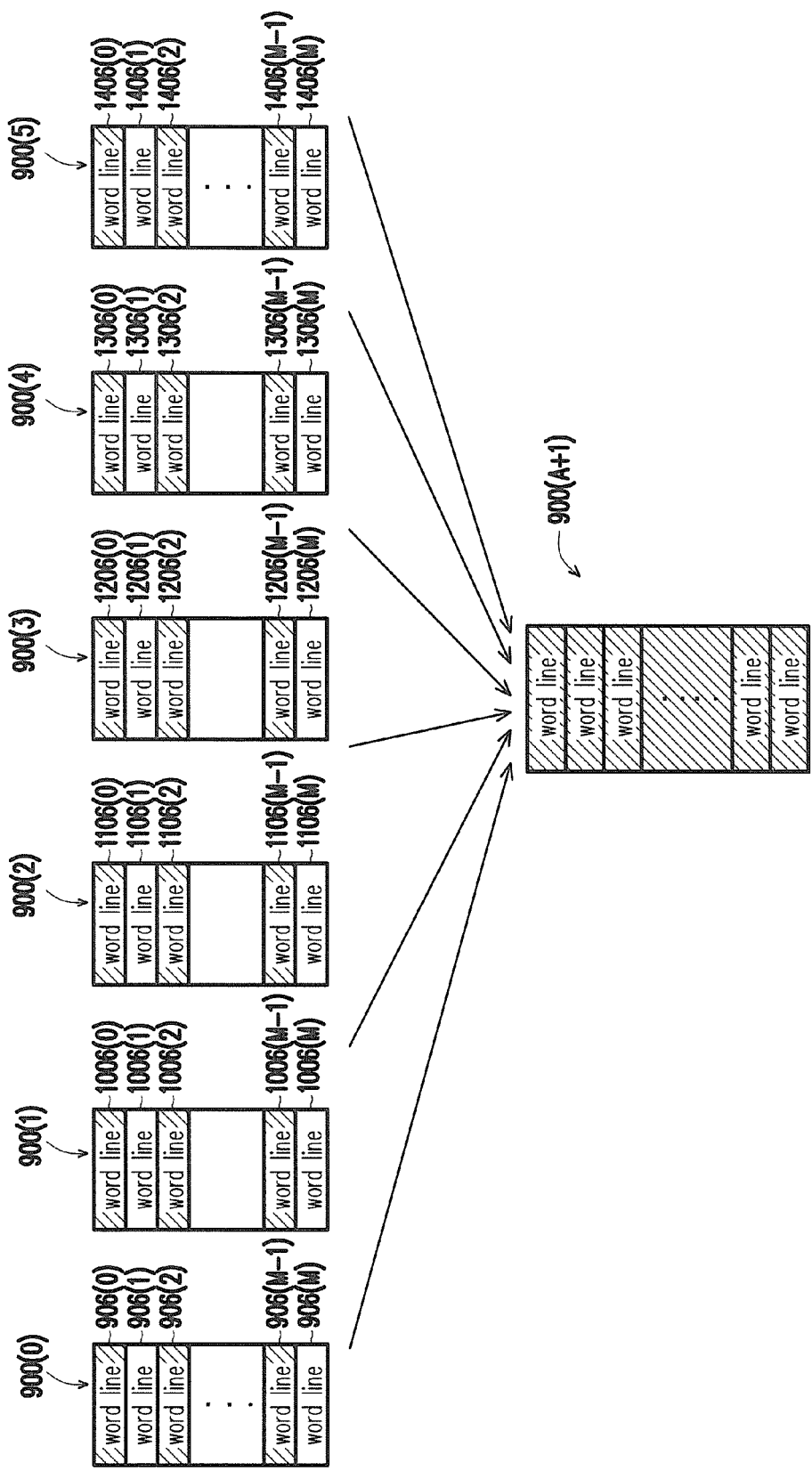
FIG. 12 is a schematic diagram of programming according to another exemplary embodiment of the invention.

FIG. 12 is a schematic diagram of programming according to another exemplary embodiment of the invention.

Referring to FIG. 12, it is assumed that the physical erasing units 900(0) to 900(5) are erased, the data size of the first data is greater than the available size of the physical erasing unit 900(0), and the data size of the first data is equal to or less than a total of available sizes of six physical erasing units. As such, the memory management circuit 702 is capable of selecting the physical erasing units 900(0) to 900(5) from the first storage area 901. Then, in the first skipping programming process, the physical erasing units 900(0) to 900(5) are programmed in order to fully store the first data. The following description uses the physical erasing unit 900(1) as an example with an assumption that a programming method of each of the physical erasing units 900(0) to 900(5) is identical and similar to that used in the exemplary embodiment of FIG. 11. For example, after the word line 906(M−1) is programmed, parts of the first data not yet stored are programmed into a word line 1006(0). Then, a word line 1006(1) adjacent to the word line 1006(0) is skipped, and the parts in the first data which are not stored are programmed into a word line 1006(2) not adjacent to the word line 1006(0). And the rest may be arrived at by deduction. The word lines not adjacent to one another in the physical erasing units 900(0) to 900(5) are sequentially programmed until the first data is fully stored.

Further, in an exemplary embodiment, word lines in different physical erasing units and/or different memory planes can also be simultaneously programmed. For example, if the physical erasing units 900(0) to 900(5) are selected from the different memory planes, the first data can be simultaneously programmed into the word line 906(0), the word line 1006(0), a word line 1106(0), a word line 1206(0), a word line 1306(0) and a word line 1406(0). Then, the word line 906(1), the word line 1006(1), a word line 1106(1), a word line 1206(1), a word line 1306(1) and a word line 1406(1) respectively adjacent to corresponding one of the word line 906(0), the word line 1006(0), the word line 1106(0), the word line 1206(0), the word line 1306(0) and the word line 1406(0) is skipped. Then, the parts in the first data which are not stored are programmed into the word line 906(2), the word line 1006(2), a word line 1106(2), a word line 1206(2), a word line 1306(2) and a word line 1406(2) respectively not adjacent to corresponding one of the word line 906(0), the word line 1006(0), the word line 1106(0), the word line 1206(0), the word line 1306(0) and the word line 1406(0). And the rest may be arrived at by deduction. In addition, if the data size of the first data is greater (or smaller), more (or less) of the physical erasing units can be selected for storing the first data. Further, in another exemplary embodiment of FIG. 12, the skipping rules corresponding to different physical erasing units may also be different. For example, according to the first data, odd-numbered word lines of the physical erasing unit 900(0) are programmed, and even-numbered word lines of the physical erasing unit 900(1) are programmed.

After the first data is stored into one or more physical erasing units selected from the first storage area 901, the first data stored in the first storage area 901 is copied into one or more physical erasing units in the second storage area 902. For example, in the exemplary embodiment of FIG. 12, it is assumed that all of the physical erasing units 900(0) to 900(5) are used in the second programming mode (e.g., one memory cell stores one bit) and the physical erasing unit 900(A+1) is used ins the first programming mode (e.g., one memory cell stores three bits). As such, the first data stored in the physical erasing units 900(0) to 900(5) can be copied to the physical erasing unit 900(A+1). Among them, the physical erasing unit 900(A+1) is also known as a fourth physical erasing unit. Accordingly, as compared to the conventional method, errors generated in the first data copied to the physical erasing unit 900(A+1) due to the cell to cell interference may be reduced. After the first data is fully copied from the first storage area 901 into the second storage area 902, the physical erasing units used for temporarily storing the first data in the first storage area 901 are erased.

In the present exemplary embodiment, after aforesaid first write command is received, the memory management circuit 702 may further receive another one or more write commands (also known as a second write command) from the host system 11. The second write command instructs to write second data into the rewritable non-volatile memory module 406. As similar to the first data, the second data may also include sequential data and/or non-sequential data, and the related description is not repeated hereinafter. According to the second write command, the memory management circuit 702 selects one or more physical erasing units from the first storage area 901 and sends another skipping write command sequence (also known as a second skipping write command sequence) to the rewritable non-volatile memory module 406. The second skipping write command sequence includes one or more instruction codes or program codes. The second skipping write command sequence instructs the rewritable non-volatile memory module 406 to execute another skipping programming process (also known as a second skipping programming process).

In the present exemplary embodiment, according to the second write command, the memory management circuit 702 is capable of selecting any available physical erasing units (also known as a third physical erasing unit) from the first storage area 901 in order to store the second data. A storing method of the second data may refer to above descriptions regarding the storing method of the first data. The third physical erasing unit may include aforesaid first physical erasing unit or other physical erasing units in the first storage area 901. For example, after the first physical erasing unit is erased, according to the second write command, the memory management circuit 702 is capable of selecting aforesaid first physical erasing unit from the first storage area 901 once again in order to temporarily store the second data. If the memory management circuit 702 selects the first physical erasing unit to temporarily store the second data, the rewritable non-volatile memory module 406 can select to program the word lines of the first physical erasing unit which are not programmed in the previous skipping programming process in the second skipping programming process. For example, in an exemplary embodiment, after the second write command is received, the memory management circuit 702 can determine whether the first skipping programming process uses a first skipping rule or a second skipping rule and sends the second skipping write command sequence according to whether the first skipping programming process uses the first skipping rule or the second skipping rule. The first skipping rule and the second skipping rule are distinguished by, for example, whether the programmed word lines belong to the odd-numbered word lines or the even-numbered word lines. For example, in the exemplary embodiments of FIG. 11 and FIG. 12, because the programmed word lines all belong to the even-numbered word lines (e.g., the word lines 906(0), 906(2), 906(4), . . . , 906(M−3), 906(M−1)), it indicates that the first skipping programming process uses the first skipping rule in the exemplary embodiments of FIG. 11 and FIG. 12. In this case, the memory management circuit 702 can instruct to program the second data into the odd-numbered word lines (e.g., the word lines 906(1), 906(3), 906(5) . . . , 906(M−2), 906(M)) of the first physical erasing unit according to the second skipping rule. Alternatively, in another exemplary embodiment, if the odd-number word lines are programmed in the previous skipping programming process for the first physical erasing unit, it indicates that the second skipping rule is used in the previous skipping programming process for the first physical erasing unit. Therefore, in the next skipping programming process for the first physical erasing unit, the memory management circuit 702 can instruct to program the second data into the even-numbered word lines of the first physical erasing unit according to the first skipping rule. Further, in another exemplary embodiment, the memory management circuit 702 may also freely use the first skipping rule or the second skipping rule without executing aforesaid operation of determining whether the first skipping programming process uses the first skipping rule or the second skipping rule. For example, two consecutive skipping programming process for the same physical erasing unit can both use the same skipping rule (e.g., the first skipping rule). Alternatively, in another exemplary embodiment, the first skipping rule and the second skipping rule may also be configured according to any selection rules for the word lines.

Figure 13:
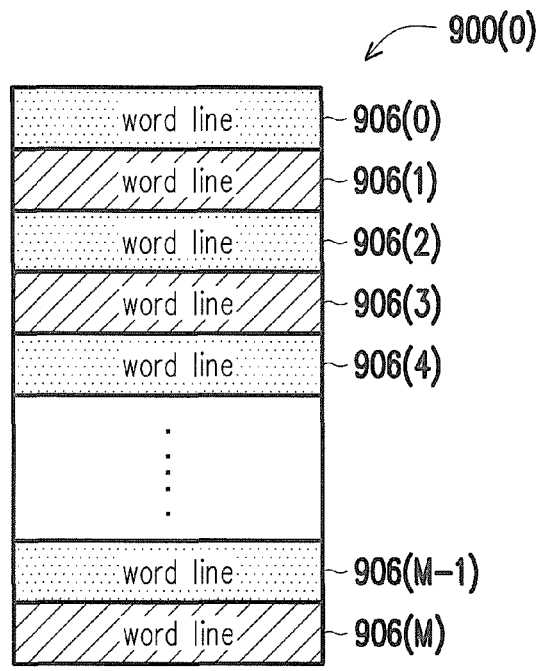
FIG. 13 is a schematic diagram of programming according to another exemplary embodiment of the invention.

FIG. 13 is a schematic diagram of programming according to another exemplary embodiment of the invention.

Referring to FIG. 13 as continuation to the exemplary embodiment of FIG. 11 or FIG. 12, after the physical erasing unit 900(0) is erased, if the physical erasing unit 900(0) is selected to temporarily store the second data and a (M+1)/2 number of word lines are required to temporarily store the second data, a plurality of word lines not adjacent to one another among the word lines 906(0) to 906(M) are programmed in order to store the second data in the second skipping programming process. For example, according to the second skipping rule, the word line 906(0) is skipped, and the word line 906(1) is programmed. Then, the word line 906(2) is skipped, and the word line 906(3) is programmed. Thereafter, the word lines 906(4), 906(6) . . . , 906(M−3) and 906(M−1) are sequentially skipped, and the word lines 906(5), 906(7) . . . , 906(M−2) and 906(M) are sequentially programmed. In another exemplary embodiment, an operation of selecting a plurality of physical erasing units in the first storage area 901 due to a data size of the second data being too large may be deduced with reference to the exemplary embodiment of FIG. 12. For example, in another exemplary embodiment of FIG. 12, after the physical erasing units 900(0) to 900(5) are erased, the word lines of the physical erasing units 900(0) to 900(5) which are not programmed in the first skipping programming process and not adjacent to one another (i.e., areas without slash lines in FIG. 12) may then be programmed according to the second data. Later, the second data temporarily stored in the first storage area 901 is copied into one or more physical erasing units in the second storage area 902. Moreover, in the present exemplary embodiment, the word line 906(3) is also known as a seventh word line.

It is worth mentioning that, in the foregoing exemplary embodiment, the first physical erasing unit is used as the third physical erasing unit for example. However, in another exemplary embodiment, other physical erasing units may also be selected to be the third physical erasing unit, and the second data may be written into the third physical erasing unit according to the method introduced in the exemplary embodiment of FIG. 13. In other word, in another exemplary embodiment of FIG. 13, it is assumed that the word lines 906(0) to 906(M) are a plurality of word lines of arbitrary kind of the third physical erasing unit. In the second skipping programming process, according to the second data, the word lines not adjacent to one another (e.g., the word lines 906(1), 906(3), 906(5), . . . , 906(M−3) and 906(M−1)) may be programmed and the word lines adjacent to the programmed word lines (e.g., the word lines 906(0), 906(2), 906(4), . . . , 906(M−2) and 906(M)) are skipped.

In the exemplary embodiments of FIG. 11 to FIG. 13, in one physical erasing unit, there is one skipped word line between two word lines which are consecutively programmed but not adjacent to each other. However, in another exemplary embodiment, there can be more word lines existed there between the two word lines which are consecutively programmed but not adjacent to each other. That is to say, amounts of the second word line and/or the fifth word line may be greater than 1.

Figure 14:
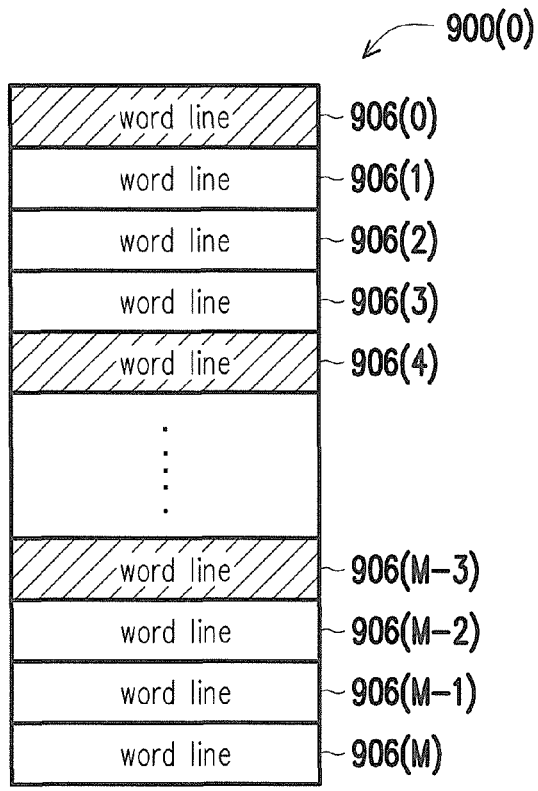
FIG. 14 and FIG. 15 are schematic diagrams of programming according to another exemplary embodiment of the invention.
Figure 15:
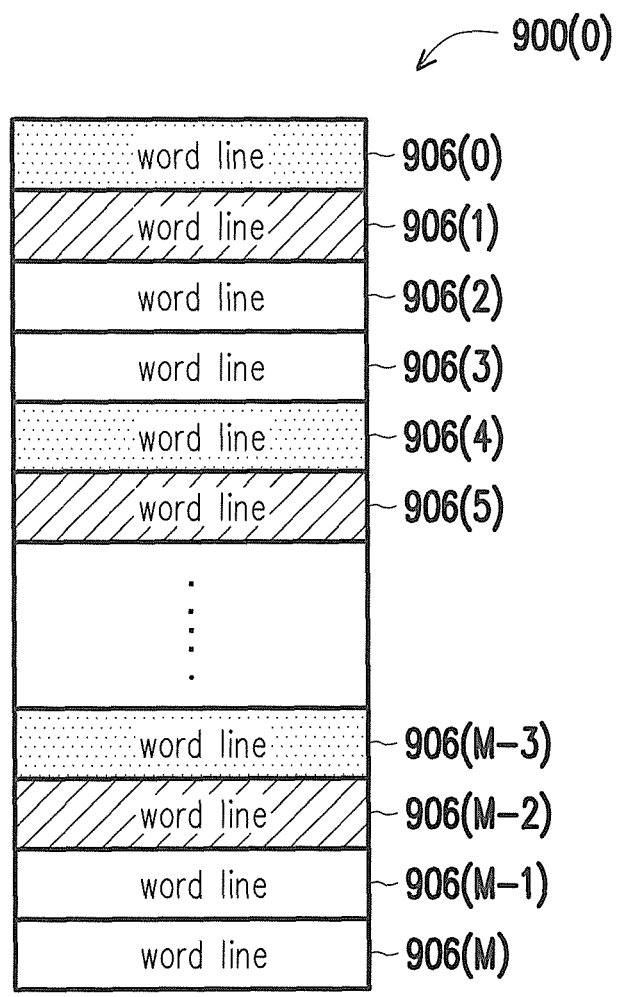

FIG. 14 and FIG. 15 are schematic diagrams of programming according to another exemplary embodiment of the invention.

Referring to FIG. 14, when the first skipping programming process is executed, the word line 906(0) is programmed; then, the word lines 906(1) to 906(3) are skipped, and the word line 906(4) is programmed; then, the word lines 906(5) to 906(7) are skipped, and the word line 906(8) is programmed. And the rest may be arrived at by deduction. Referring to FIG. 15, after the physical erasing unit 900(0) is erased and when the second skipping programming process is executed, the word line 906(0) is skipped, and the word line 906(1) is programmed; then, the word lines 906(2) to 906(4) are skipped, and the word line 906(5) is programmed; then, the word lines 906(6) to 906(8) are skipped, and the word line 906(9) is programmed. And the rest may be arrived at by deduction. However, the invention is not limited thereto. In another exemplary embodiment, it is also possible that two, four or more word lines are existed there between the two word lines which are consecutively programmed but not adjacent to each other.

In the foregoing exemplary embodiments, it is preset to program the word lines of each of the physical erasing units 900(0) to 900(A) in the first storage area 901 by executing the skipping programming process. However, in another exemplary embodiments, it is also possible to change to program the word lines of specific one or more physical erasing units by executing the skipping programming process only when a specific condition is matched. For example, the memory management circuit 702 can determine whether a state (also known as a current state) of the rewritable non-volatile memory module 406 matches one or more conditions (also known as a first condition). If the current state of the rewritable non-volatile memory module 406 matches the first condition, the memory management circuit 702 sends aforesaid first skipping write command sequence or aforesaid second skipping write command sequence. If the current state of the rewritable non-volatile memory module 406 does not match the first condition, the memory management circuit 702 sends a normal write command sequence instead. The normal write command sequence instructs the rewritable non-volatile memory module 406 to execute a normal programming process. In the normal programming process, the adjacent word lines can be programmed in order to store data. For example, in another exemplary embodiment of FIG. 11, when the rewritable non-volatile memory module 406 executes the normal programming process, according to the first data, the word line 906(0) is the first to be programmed. After the word line 906(0) is programmed, the word line 906(1) can be programmed. After the word line 906(1) is programmed, the word line 906(2) can also be programmed. And the rest may be arrived at by deduction. In other words, in the normal programming process, as long as all or parts of the word lines of one physical erasing unit which are adjacent to each other are available, none of those word line is skipped. In addition, the operation of determining whether the current state of the rewritable non-volatile memory module 406 matches the first condition can be executed immediately after the write command (e.g., the first write command or the second write command) is received. Alternatively, the operation of determining whether the current state of the rewritable non-volatile memory module 406 matches the first condition may also refer to searching of one lookup table. For example, in an exemplary embodiment, the operation of determining whether the current state of the rewritable non-volatile memory module 406 matches the first condition can be executed in advance, so that a determination result thereof can be recorded into a lookup table. Accordingly, after the write command (e.g., the first write command or the second write command) is received, the determination result may be obtained immediately according to the lookup table.

In an exemplary embodiment, the memory management circuit 702 is capable of determining whether the usage level of the first physical erasing unit reaches a preset level. The method regarding how to evaluate the usage level of one physical erasing unit is already described in detail as the above, which is not repeated hereinafter. If the usage level of the first physical erasing unit reaches the preset level (e.g., the erasing count of the first physical erasing unit reaches 20000 times), the memory management circuit 702 determines that the current state of the rewritable non-volatile memory module 406 matches the first condition. If the usage level of the first physical erasing unit does not reach the preset level (e.g., the erasing count of the first physical erasing unit does not reach 20000 times), the memory management circuit 702 determines that the current state of the rewritable non-volatile memory module 406 does not match the first condition. In addition, in an exemplary embodiment, the memory management circuit 702 is capable of counting for a number of errors with a specific type in the first physical erasing unit. If the number of the errors with the specific type in the first physical erasing unit exceeds a preset umber, it can also be determined that the usage level of the first physical erasing unit reaches the preset level. For example, the errors with the specific type include a high reliability error. The high reliability error is characterized in that a value (or an absolute value) of a log likelihood ratio (LLR) corresponding thereto usually exceeds a preset value. In addition, the memory management circuit 702 can also determine that the usage level of the first physical erasing unit reaches the preset level after errors in the first physical erasing unit exceeds another preset number.

In an exemplary embodiment, the memory management circuit 702 is capable of determining whether the memory storage device 10 or the rewritable non-volatile memory module 406 is processed by a high temperature process. During the high temperature process, the storage statuses of the memory cells can be changed. For example, the high temperature process refers to a flow convection oven process. Particularly, the high temperature process is especially important for a manufacturing process of an embedded multimedia card. If the memory storage device 10 or the rewritable non-volatile memory module 406 is processed by the high temperature process, the memory management circuit 702 can determine that the current state of the rewritable non-volatile memory module 406 matches the first condition. If the memory storage device 10 or the rewritable non-volatile memory module 406 is not yet processed by the high temperature process, the memory management circuit 702 can determine that the current state of the rewritable non-volatile memory module 406 does not match the first condition. Moreover, in another exemplary embodiment, the high temperature process may include other processing stages of the memory storage device 10 or the rewritable non-volatile memory module 406, or may be replaced by any processing stage of the memory storage device 10 or the rewritable non-volatile memory module 406.

In an exemplary embodiment, the memory management circuit 702 is capable of determining whether a total available size of the first storage area 901 is less than a data size of the data which is instructed by one or more write commands to be written into the rewritable non-volatile memory module 406. In the present exemplary embodiment, the total available size of the first storage area 901 is equal to 1/P the size of the total storage space of the first storage area 901. Among them, P is an integer greater than 1, and a value of P relates to the skipping rule being used. For example, in the exemplary embodiments of FIG. 11 to FIG. 13, a number of the word lines being skipped each time is 1, and thus the value of P is 2. In other words, in the exemplary embodiments of FIG. 11 to FIG. 13, take the physical erasing unit 900(0) as an example, the memory cells of the physical erasing unit 900(0) that can be programmed is only a half of all the memory cells of the physical erasing unit 900(0). Therefore, if each of the physical erasing units 900(0) to 900(A) in the first storage area 901 is programmed according to the skipping rule used in the exemplary embodiments of FIG. 11 or FIG. 12, the data size of the data temporarily stored in the first storage area 901 each time cannot exceed ½ the size of the total storage space of the first storage area 901. Further, in the exemplary embodiments of FIG. 14 to FIG. 15, a number of the word lines being skipped each time is 3, and thus the value of P is 4. In other words, if each of the physical erasing units 900(0) to 900(A) in the first storage area 901 is programmed according to the skipping rule used in the exemplary embodiments of FIG. 14 or FIG. 15, the data size of the data temporarily stored in the first storage area 901 each time cannot exceed ¼ the size of the total storage space of the first storage area 901. If the total available size of the first storage area 901 is less than the data size of the data instructed by the one or more write commands to be written into the rewritable non-volatile memory module 406, the memory management circuit 702 can determine that the current state of the rewritable non-volatile memory module 406 does not match the first condition. If the total available size of the first storage area 901 is not less than the data size of the data instructed by the one or more write commands to be written into the rewritable non-volatile memory module 406, the memory management circuit 702 can determine that the current state of the rewritable non-volatile memory module 406 matches the first condition. Further, in another exemplary embodiment, when other data are stored in the first storage area 901 before writing the current data, the total available size of the storage area 901 is less than 1/P the size of the total storage space of the first storage area 901.

In addition, the various operations above for determining whether the current state of the rewritable non-volatile memory module 406 matches the various first conditions may combine use of two, all or use solely. For example, in an exemplary embodiment, the memory management circuit 702 determines that the current state of the rewritable non-volatile memory module 406 matches the first condition and sends the skipping write command sequence only after it is determined that the usage level of the first physical erasing unit reaches the preset level, the memory storage device 10 or the rewritable non-volatile memory module 406 is processed by the high temperature process, and the total available size of the first storage area 901 is not less than the data size of the data instructed by the write command to be written into the rewritable non-volatile memory module 406.

It is worth mentioning that, in the foregoing exemplary embodiments, the physical erasing units in the first storage area 901 are used to execute the skipping programming process. However, in another exemplary embodiment, one or more physical erasing units in the second storage area 902 and/or the system area 903 can also be used to execute the skipping programming process. Alternatively, the operations mentioned in each of the foregoing exemplary embodiments may also be applied to the second storage area 902 and/or the system area 903. Further, in an exemplary embodiment, the selection of the word lines to be skipped in the executed skipping programming process is unrelated to the write command from the host system 11. For example, the selection of the word lines to be skipped or to be programmed may only relate to the skipping programming process previously executed. Further, in an exemplary embodiment, the skipping programming process and the normal programming process are executed by the control circuit in the rewritable non-volatile memory module 406 (e.g., the control circuit 512 in FIG. 5).

Figures 16, 17:
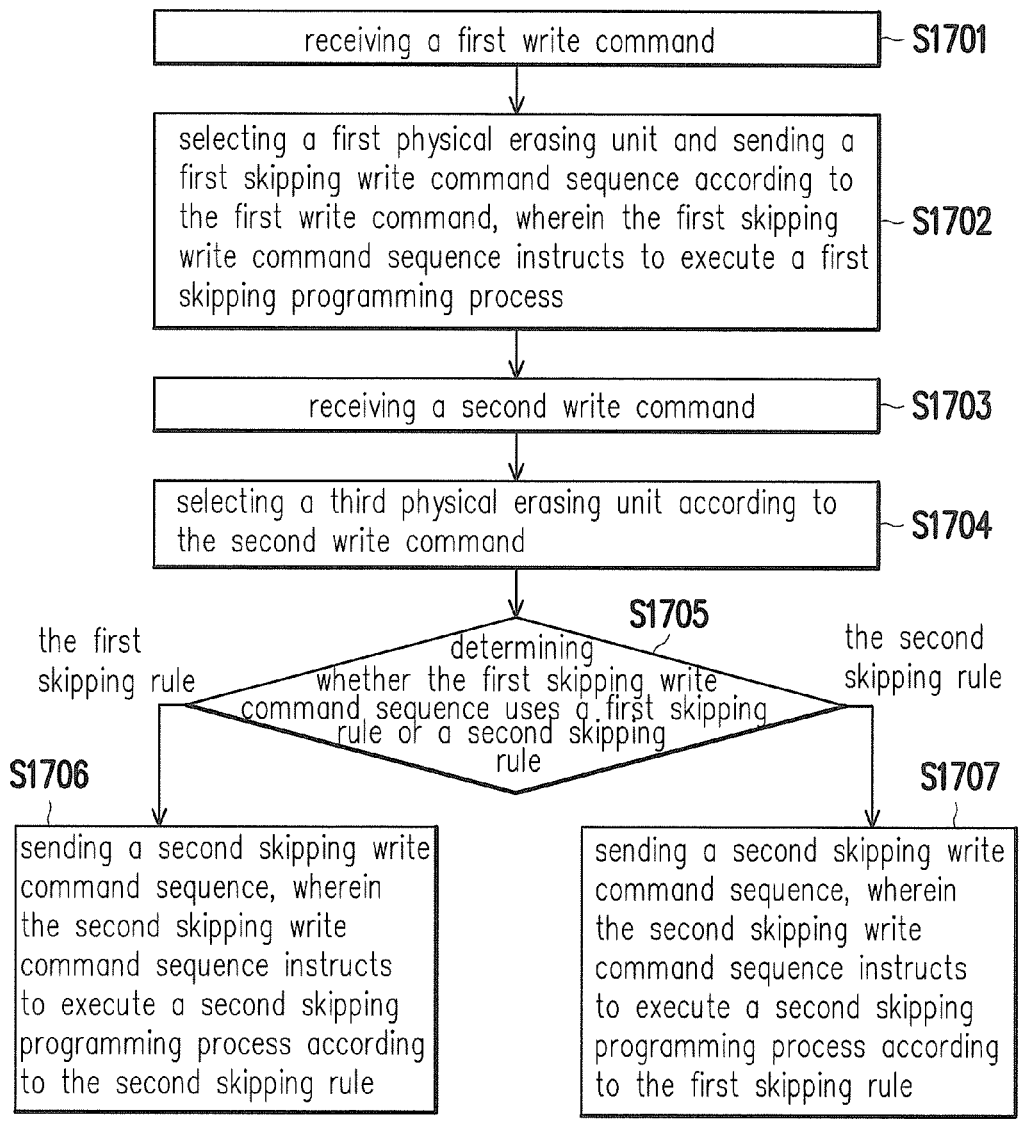
FIG. 16 is a flowchart illustrating a programming method according to an exemplary embodiment of the invention.
FIG. 17 is a flowchart illustrating a programming method according to another exemplary embodiment of the invention.

FIG. 16 is a flowchart illustrating a programming method according to an exemplary embodiment of the invention.

Referring to FIG. 16, in step S1601, a first write command is received. In step S1602, a first physical erasing unit is selected from a plurality of physical erasing units and a first skipping write command sequence is sent according to the first write command. The first skipping write command sequence instructs to execute a first skipping programming process.

FIG. 17 is a flowchart illustrating a programming method according to another exemplary embodiment of the invention.

Referring to FIG. 17, in step S1701, a first write command is received. In step S1702, a first physical erasing unit is selected from a plurality of physical erasing units and a first skipping write command sequence is sent according to the first write command. The first skipping write command sequence instructs to execute a first skipping programming process. In step S1703, a second write command is received. In step S1704, a third physical erasing unit is selected from the physical erasing units according to the second write command. The third physical erasing unit may be a physical erasing unit identical to the first physical erasing unit, or may be a physical erasing unit different from the first physical erasing unit. In step S1705, whether the first skipping write command sequence for the third physical erasing unit uses a first skipping rule or a second skipping rule is determined. If the first skipping write command sequence for the third physical erasing unit uses the first skipping rule, a second skipping write command is sent in step S1706, and the second skipping write command sequence instructs to execute a second skipping programming process according to the second skipping rule. If the first skipping write command sequence for the third physical erasing unit uses the second skipping rule, a second skipping write command is sent in step S1707, and the second skipping write command sequence instructs to execute a second skipping programming process according to the first skipping rule.

Figure 18:
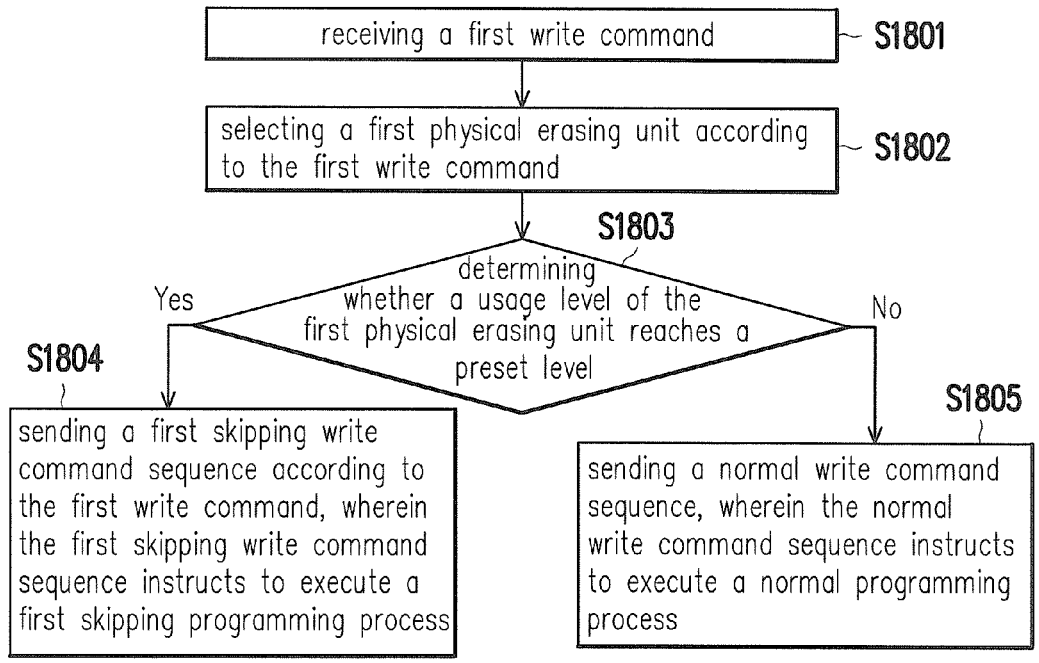
FIG. 18 is a flowchart illustrating a programming method according to another exemplary embodiment of the invention.

FIG. 18 is a flowchart illustrating a programming method according to another exemplary embodiment of the invention.

Referring to FIG. 18, in step S1801, a first write command is received. In step S1802, a first physical erasing unit is selected from a plurality of physical erasing units according to the first write command. In step S1803, whether a usage level of the first physical erasing unit reaches a preset level is determined. If the usage level of the first physical erasing unit reaches the preset level, a first skipping write command sequence is sent according to the first write command in step S1804, and the first skipping write command sequence instructs to execute a first skipping programming process. If the usage level of the first physical erasing unit does not reach the preset level, a natural write command sequence is sent according to the first write command in step S1805, and the normal write command sequence instructs to execute a normal programming process.

Figure 19:
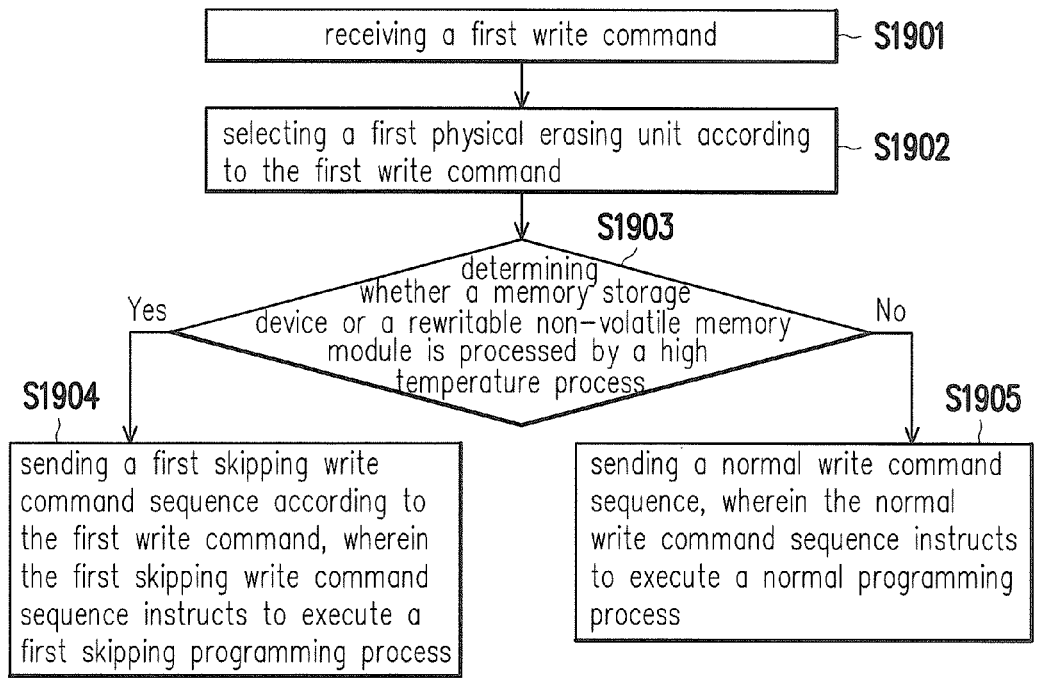
FIG. 19 is a flowchart illustrating a programming method according to another exemplary embodiment of the invention.

FIG. 19 is a flowchart illustrating a programming method according to another exemplary embodiment of the invention.

Referring to FIG. 19, in step S1901, a first write command is received. In step S1902, a first physical erasing unit is selected from a plurality of physical erasing units according to the first write command. In step S1903, whether a memory storage device or a rewritable non-volatile memory module is processed by a high temperature process is determined. If the memory storage device or the rewritable non-volatile memory module is processed by the high temperature process, a first skipping write command sequence is sent according to the first write command in step S1904, and the first skipping write command sequence instructs to execute a first skipping programming process. If the memory storage device or the rewritable non-volatile memory module is not yet processed by the high temperature process, a normal write command sequence is sent according to the first write command in step S1905, and the normal write command sequence instructs to execute a normal programming process.

Figure 20:
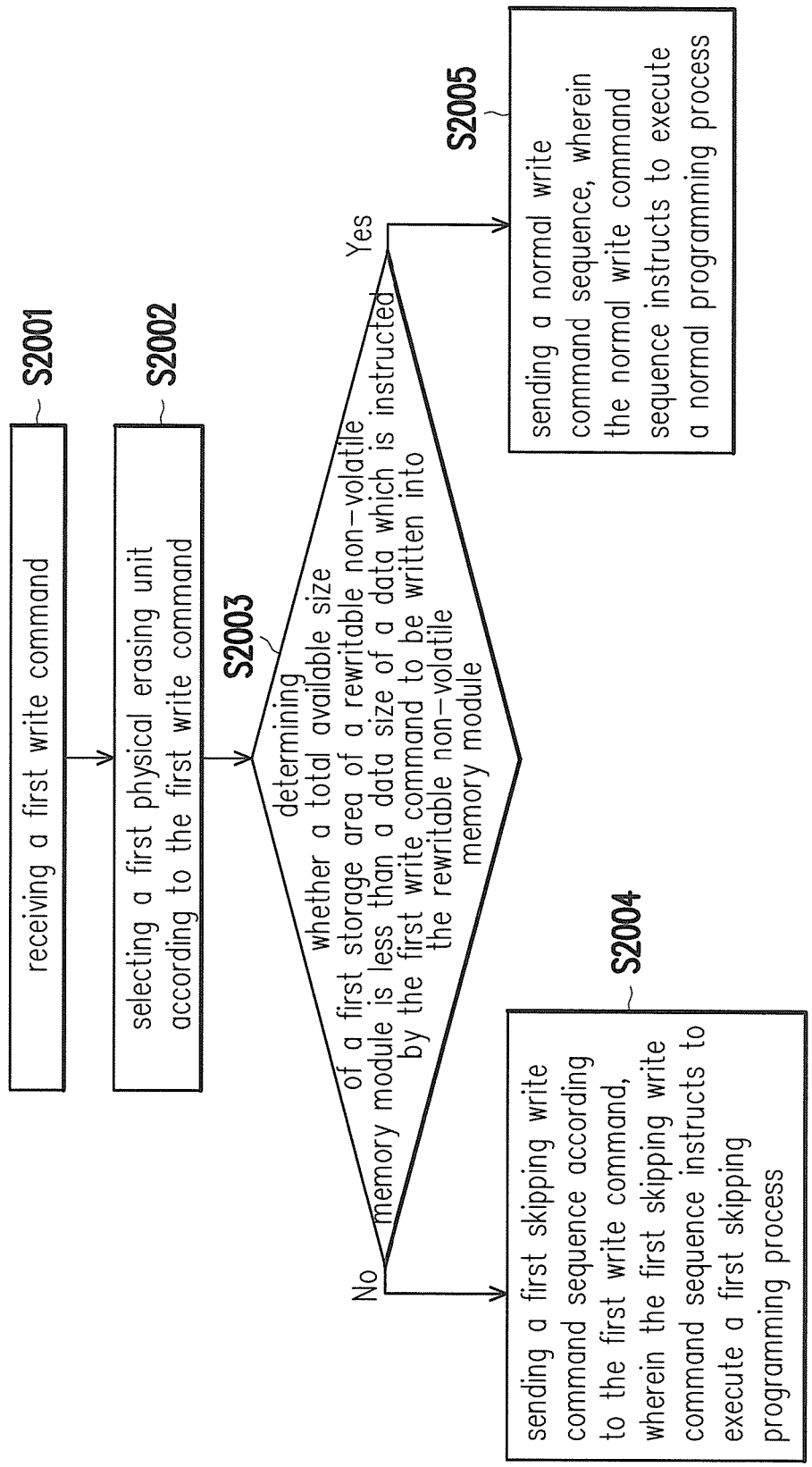
FIG. 20 is a flowchart illustrating a programming method according to another exemplary embodiment of the invention.

FIG. 20 is a flowchart illustrating a programming method according to another exemplary embodiment of the invention.

Referring to FIG. 20, in step S2001, a first write command is received. In step S2002, a first physical erasing unit is selected from a plurality of physical erasing units according to the first write command. In step S2003, whether a total available size of a first storage area of a rewritable non-volatile memory module is less than a data size of a data which is instructed by the first write command to be written into the rewritable non-volatile memory module is determined. If the total available size of the first storage area of the rewritable non-volatile memory module is not less than the data size of the data which is instructed by the first write command to be written into the rewritable non-volatile memory module, a first skipping write command sequence is sent according to the first write command in step S2004, and the first skipping write command sequence instructs to execute a first skipping programming process. If the total available size of the first storage area of the rewritable non-volatile memory module is less than the data size of the data which is instructed by the first write command to be written into the rewritable non-volatile memory module, a normal write command sequence is sent according to the first write command in step S2005, and the normal write command sequence instructs to execute a normal programming process.

Figure 21:
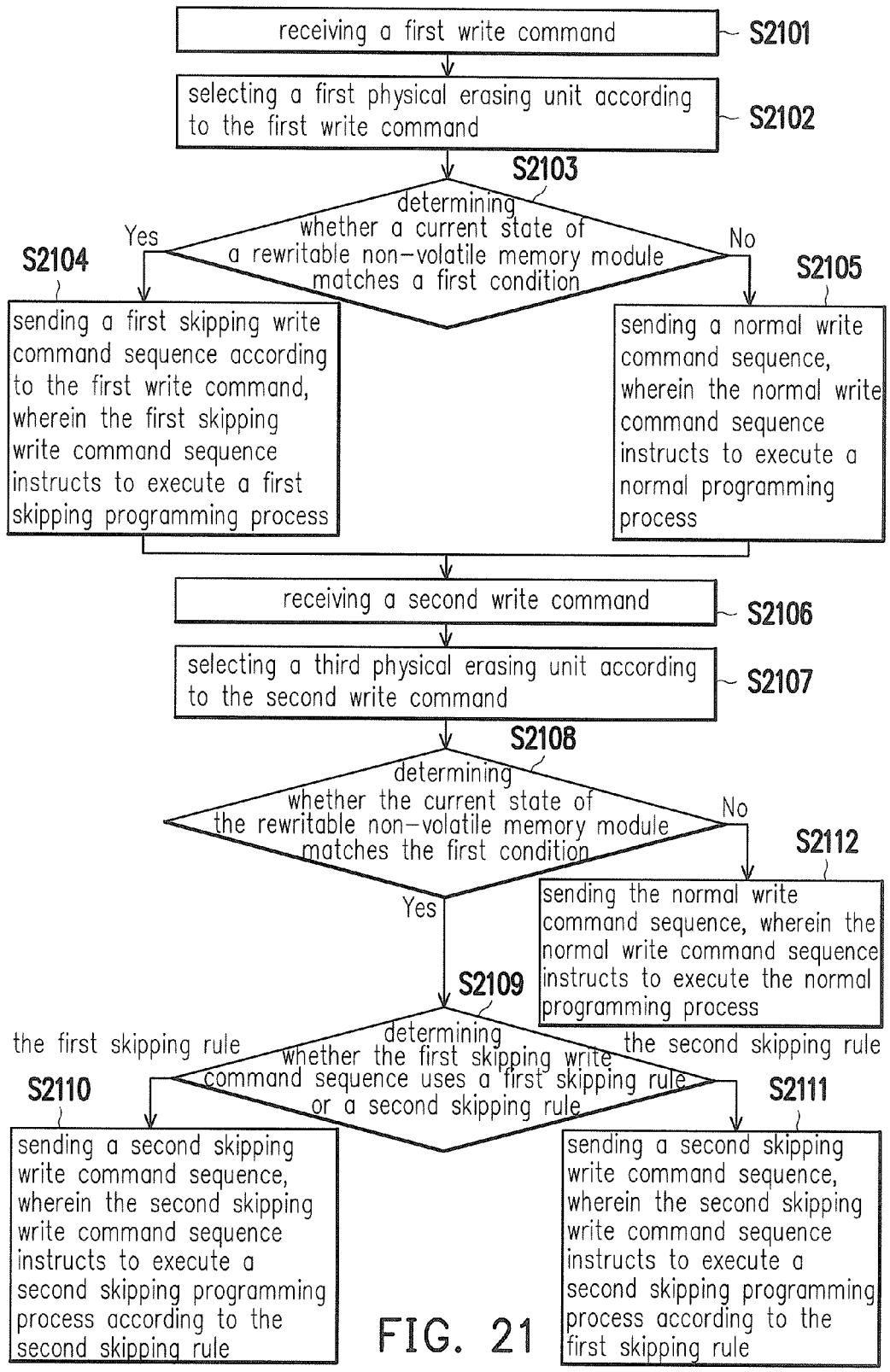
FIG. 21 is a flowchart illustrating a programming method according to another exemplary embodiment of the invention.

FIG. 21 is a flowchart illustrating a programming method according to another exemplary embodiment of the invention.

Referring to FIG. 21, in step S2101, a first write command is received. In step S2102, a first physical erasing unit is selected from a plurality of physical erasing units according to the first write command. In step S2103, whether a current state of a rewritable non-volatile memory module matches a first condition is determined. If the current state of the rewritable non-volatile memory module matches the first condition, a first skipping write command sequence is sent according to the first write command in step S2104, and the first skipping write command sequence instructs to execute a first skipping programming process. If the current state of the rewritable non-volatile memory module does not match the first condition, a normal write command sequence is sent according to the first write command in step S2105, and the normal write command sequence instructs to execute a normal programming process. In step S2106, a second write command is received. In step S2107, a third physical erasing unit is selected from the physical erasing units according to the second write command. The third physical erasing unit may be a physical erasing unit identical to the first physical erasing unit, or may be a physical erasing unit different from the first physical erasing unit. In step S2108, whether the current state of the rewritable non-volatile memory module matches the first condition is determined. If it is determined in step S2108 that the current state of the rewritable non-volatile memory module matches the first condition, whether the first skipping write command sequence for the third physical erasing unit uses a first skipping rule or a second skipping rule is determined in step S2109. If the first skipping write command sequence for the third physical erasing unit uses the first skipping rule, a second skipping write command is sent in step S2110, and the second skipping write command sequence instructs to execute a second skipping programming process according to the second skipping rule. If the first skipping write command sequence for the third physical erasing unit uses the second skipping rule, a second skipping write command is sent in step S2111, and the second skipping write command sequence instructs to execute a second skipping programming process according to the first skipping rule. If it is determined in step S2108 that the current state of the rewritable non-volatile memory module does not match the first condition, a normal write command sequence is sent according to the second write command, and the normal write command sequence instructs to execute a normal programming process.

Nevertheless, each of steps depicted in FIG. 16 to FIG. 21 have been described in detail as above, thus related description thereof is not repeated hereinafter. It should be noted that, the steps depicted in FIG. 16 to FIG. 21 may be implemented as a plurality of program codes or circuits, which are not particularly limited in the invention. Moreover, the methods disclosed in FIG. 16 to FIG. 21 may be implemented with reference to above embodiments, or may be implemented separately, which are not particularly limited in the invention.

In summary, the skipping write command sequence proposed by an exemplary embodiment of the invention is configured to instruct to execute the skipping programming process. In the skipping programming process, the adjacent word lines are not used for storing data. Accordingly, the errors generated by programming the adjacent word lines may then be reduced.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A programming method for a rewritable non-volatile memory module comprising a plurality of physical erasing units, and the programming method comprising:
   receiving at least one first write command;
   determining whether a current state of the rewritable non-volatile memory module matches at least one first condition;
   selecting a first physical erasing unit from the physical erasing units and sending a first skipping write command sequence according to the at least one first write command after it is determined that the current state of the rewritable non-volatile memory module matches the at least one first condition, wherein the first skipping write command sequence instructs to execute a first skipping programming process,
   wherein the first skipping programming process comprises:
      programming a first word line among a plurality of word lines of the first physical erasing unit according to first data corresponding to the at least one first write command; and
      after the first word line is programmed, skipping at least one second word line adjacent to the first word line among the word lines of the first physical erasing unit, and programming a third word line not adjacent to the first word line among the word lines of the first physical erasing unit according to the first data; and
   sending a normal write command sequence if the current state of the rewritable non-volatile memory module does not match the at least one first condition, wherein the normal write command sequence instructs to execute a normal programming process,
   wherein the normal programming process comprises:
      programming the first word line according to the first data; and
      after the first word line is programmed, programming the at least one second word line according to the first data.

2. The programming method of claim 1, wherein the first physical erasing unit comprises a M+1 number of word lines, the first word line is a $N^{th}$ word line among the M+1 number of word lines, the at least one second word line is a $(N+1)^{th}$ word line among the M+1 number of word lines, and the third word line is a $(N+2)^{th}$ word line among the M+1 number of word lines, wherein M and N are positive integers.

3. The programming method of claim 1, further comprising:
   determining whether a data size of the first data exceeds an available size of the first physical erasing unit, wherein the available size of the first physical erasing unit is less than or equal to 1/P of a total storage space of the first physical erasing unit, and P is an integer greater than 1; and
   if the data size of the first data exceeds the available size of the first physical erasing unit, selecting a second physical erasing unit from the physical erasing units,
   wherein the first skipping programming process further comprises:
      programming a fourth word line among the word lines of the second physical erasing unit according to the first data; and
      after the fourth word line is programmed, skipping at least one fifth word line adjacent to the fourth word line among the word lines of the second physical erasing unit, and programming a sixth word line not adjacent to the fourth word line among the word lines of the second physical erasing unit according to the first data.

4. The programming method of claim 1, further comprising:
   after the at least one first write command is received, receiving at least one second write command;
   selecting a third physical erasing unit from the physical erasing units and sending a second skipping write command sequence according to the at least one second write command, wherein the second skipping write command sequence instructs to execute a second skipping programming process,
   wherein the second skipping programming process comprises:
      skipping the first word line among the word lines of the third physical erasing unit, and programming the second word line among the word lines of the third physical erasing unit according to second data corresponding to the at least one second write command; and
      after the second word line is programmed, skipping the third word line among the word lines of the third physical erasing unit, and programming a seventh word line not adjacent to the programmed second word line among the word lines of the third physical erasing unit according to the second data.

5. The programming method of claim 1, wherein the step of determining whether the current state of the rewritable non-volatile memory module matches the at least one first condition comprises:
   determining whether a usage level of the first physical erasing unit reaches a preset level.

6. The programming method of claim 1, wherein the step of determining whether the current state of the rewritable non-volatile memory module matches the at least one first condition comprises:
   determining whether the rewritable non-volatile memory module is processed by a high temperature process.

7. The programming method of claim 1, wherein the step of determining whether the current state of the rewritable non-volatile memory module matches the at least one first condition comprises:
   determining whether a total available size of a first storage area of the rewritable non-volatile memory module is less than a data size of the first data, wherein the total available size of the first storage area is less than or equal to 1/P of a total storage space of the first storage area, wherein P is an integer greater than 1.

8. The programming method of claim 1, further comprising:

after the at least one first write command is received, receiving at least one second write command;

determining whether the first skipping programming process uses a first skipping rule or a second skipping rule;

if the first skipping programming process uses the first skipping rule, instructing to use the second skipping rule in a second skipping programming process corresponding to the at least one second write command; and if the first skipping programming process uses the second skipping rule, instructing to use the first skipping rule in the second skipping programming process.

9. The programming method of claim 8, wherein the rewritable non-volatile memory module comprises a first storage area and a second storage area, and the first skipping programming process or the second skipping programming process is used only in the first storage area.

10. The programming method of claim 9, further comprising:

copying the first data stored in the first physical erasing unit into a fourth physical erasing unit among the physical erasing units.

11. The programming method of claim 10, wherein the first physical erasing unit belongs to the first storage area, the fourth physical erasing unit belongs to the second storage area, the first storage area uses a second programming mode, and the second storage area uses a first programming mode.

12. The programming method of claim 8, wherein the rewritable non-volatile memory module comprises a first storage area and a second storage area, and the first skipping programming process or the second skipping programming process is used only in the second storage area.

13. A memory storage device, comprising:

a connection interface unit configured to couple to a host system;

a rewritable non-volatile memory module comprising a plurality of physical erasing units; and a memory controlling circuit unit, coupled to the connection interface unit and the rewritable non-volatile memory module, wherein the memory controlling circuit unit is configured to receive at least one first write command, wherein the memory controlling circuit unit is further configured to select a first physical erasing unit from the physical erasing units and send a first skipping write command sequence according to the at least one first write command, wherein the first skipping write command sequence instructs to execute a first skipping programming process, wherein the first skipping programming process comprises:

programming a first word line among a plurality of word lines of the first physical erasing unit according to first data corresponding to the at least one first write command; and after the first word line is programmed, skipping at least one second word line adjacent to the first word line among the word lines of the first physical erasing unit, and programming a third word line not adjacent to the first word line among the word lines of the first physical erasing unit according to the first data, wherein the memory controlling circuit unit is further configured to receive at least one second write command after the at least one first write command is received, wherein the memory controlling circuit unit is further configured to determine whether the first skipping programming process uses a first skipping rule or a second skipping rule, wherein the memory controlling circuit unit is further configured to instruct to use the second skipping rule in a second skipping programming process corresponding to the at least one second write command if the first skipping programming process uses the first skipping rule, wherein the memory controlling circuit unit is further configured to instruct to use the first skipping rule in the second skipping programming process if the first skipping programming process uses the second skipping rule.

14. The memory storage device of claim 13, wherein the first physical erasing unit comprises a M+1 number of word lines, the first word line is a $N^{th}$ word line among the M+1 number of word lines, the at least one second word line is a $(N+1)^{th}$ word line among the M+1 number of word lines, and the third word line is a $(N+2)^{th}$ word line among the M+1 number of word lines, wherein M and N are positive integers.

15. The memory storage device of claim 13, wherein the memory controlling circuit unit is further configured to determine whether a data size of the first data exceeds an available size of the first physical erasing unit, wherein the available size of the first physical erasing unit is less than or equal to 1/P of a total storage space of the first physical erasing unit, and P is an integer greater than 1, wherein if the data size of the first data exceeds the available size of the first physical erasing unit, the memory controlling circuit unit is further configured to select a second physical erasing unit from the physical erasing units, wherein the first skipping programming process further comprises:

programming a fourth word line among the word lines of the second physical erasing unit according to the first data; and after the fourth word line is programmed, skipping at least one fifth word line adjacent to the fourth word line among the word lines of the second physical erasing unit, and programming a sixth word line not adjacent to the fourth word line among the word lines of the second physical erasing unit according to the first data.

16. The memory storage device of claim 13, wherein the memory controlling circuit unit is further configured to select a third physical erasing unit from the physical erasing units and send a second skipping write command sequence according to the at least one second write command, wherein the second skipping write command sequence instructs to execute the second skipping programming process, wherein the second skipping programming process comprises:

skipping the first word line among the word lines of the third physical erasing unit, and programming the second word line among the word lines of the third physical erasing unit according to second data corresponding to the at least one second write command; and after the second word line is programmed, skipping the third word line among the word lines of the third physical erasing unit, and programming a seventh word line not adjacent to the programmed second word line among the word lines of the third physical erasing unit according to the second data.

17. The memory storage device of claim 13, wherein the memory controlling circuit unit is further configured to determine whether a current state of the rewritable non-volatile memory module matches at least one first condition, wherein the first skipping write command sequence is sent after determining that the current state of the rewritable non-volatile memory module matches the at least one first condition,
wherein if the current state of the rewritable non-volatile memory module does not match the at least one first condition, the memory controlling circuit unit is further configured to send a normal write command sequence, wherein the normal write command sequence instructs to execute a normal programming process,
wherein the normal programming process comprises:
programming the first word line according to the first data; and
after the first word line is programmed, programming the at least one second word line according to the first data.

18. The memory storage device of claim 17, wherein the operation of the memory controlling circuit unit for determining whether the current state of the rewritable non-volatile memory module matches the at least one first condition comprises:
determining whether a usage level of the first physical erasing unit reaches a preset level.

19. The memory storage device of claim 17, wherein the operation of the memory controlling circuit unit for determining whether the current state of the rewritable non-volatile memory module matches the at least one first condition comprises:
determining whether the rewritable non-volatile memory module is processed by a high temperature process.

20. The memory storage device of claim 17, wherein the operation of the memory controlling circuit unit for determining whether the current state of the rewritable non-volatile memory module matches the at least one first condition comprises:
determining whether a total available size of a first storage area of the rewritable non-volatile memory module is less than a data size of the first data, wherein the total available size of the first storage area is less than or equal to 1/P of a total storage space of the first storage area, wherein P is an integer greater than 1.

21. The memory storage device of claim 13, wherein the rewritable non-volatile memory module comprises a first storage area and a second storage area, and the first skipping programming process or the second skipping programming process is used only in the first storage area.

22. The memory storage device of claim 21, wherein the memory controlling circuit unit is further configured to copy the first data stored in the first physical erasing unit into a fourth physical erasing unit among the physical erasing units.

23. The memory storage device of claim 22, wherein the first physical erasing unit belongs to the first storage area, the fourth physical erasing unit belongs to the second storage area, the first storage area uses a second programming mode, and the second storage area uses a first programming mode.

24. The memory storage device of claim 13, wherein the rewritable non-volatile memory module comprises a first storage area and a second storage area, and the first skipping programming process or the second skipping programming process is used only in the second storage area.

25. A memory controlling circuit unit, configured to control a rewritable non-volatile memory module, wherein the rewritable non-volatile memory module comprises a plurality of physical erasing units, and the memory controlling circuit unit comprises:
a host interface, configured to couple to a host system;
a memory interface configured to couple to the rewritable non-volatile memory module; and
a memory management circuit, coupled to the host interface and the memory mace,
wherein the memory management circuit is configured to receive at least one first write command,
wherein the memory management circuit is further configured to determine whether a current state of the rewritable non-volatile memory module matches at least one first condition,
wherein the memory management circuit is further configured to select a first physical erasing unit from the physical erasing units and send a first skipping write command sequence according to the at least one first write command after it is determined that the current state of the rewritable non-volatile memory module matches the at least one first condition, wherein the first skipping write command sequence instructs to execute a first skipping programming process,
wherein the first skipping programming process comprises:
programming a first word line among a plurality of word lines of the first physical erasing unit according to first data corresponding to the at least one first write command; and
after the first word line is programmed, skipping at least one second word line adjacent to the first word line among the word lines of the first physical erasing unit, and programming a third word line not adjacent to the first word line among the word lines of the first physical erasing unit according to the first data,
wherein the memory management circuit is further configured to send a normal write command sequence if the current state of the rewritable non-volatile memory module does not match the at least one first condition, wherein the normal write command sequence instructs to execute a normal programming process,
wherein the normal programming process comprises:
programming the first word line according to the first data; and
after the first word line is programmed, programming the at least one second word line according to the first data.

26. The memory controlling circuit unit of claim 25, wherein after the at least one first write command is received, the memory management circuit is further configured to receive at least one second write command,
wherein the memory management circuit is further configured to select a third physical erasing unit from the physical erasing units and send a second skipping write command sequence according to the at least one second write command, wherein the second skipping write command sequence instructs to execute a second skipping programming process,
wherein the second skipping programming process comprises:
skipping the first word line among the word lines of the third physical erasing unit, and programming the second word line among the word lines of the third physical erasing unit according to second data corresponding to the at least one second write command; and after the second word line is programmed, skipping the third word line among the word lines of the third physical erasing unit, and programming a seventh word line not adjacent to the programmed second word line among the word lines of the third physical erasing unit according to the second data.

27. The memory controlling circuit unit of claim 25, wherein after the at least one first write command is received, the memory management circuit is further configured to receive at least one second write command, wherein the memory management circuit is further configured to determine whether the first skipping programming process uses a first skipping rule or a second skipping rule, wherein if the first skipping programming process uses the first skipping rule, the memory management circuit is further configured to instruct to use the second skipping rule in a second skipping programming process corresponding to the at least one second write command, wherein if the first skipping programming process uses the second skipping rule, the memory management circuit is further configured to instruct to use the first skipping rule in the second skipping programming process.

28. A memory storage device, comprising:

a connection interface unit configured to couple to a host system;

a rewritable non-volatile memory module comprising a plurality of physical erasing units; and a memory controlling circuit unit, coupled to the connection interface unit and the rewritable non-volatile memory module, wherein the memory controlling circuit unit uses a first word line among a plurality of word lines of a first physical erasing unit among the physical erasing units to store first data, wherein after the first word line is used, the memory controlling circuit unit continues to use a third word line among the word lines of the first physical erasing unit to store the first data, such that a second word line between the first word and the third word line is skipped if a current state of the rewritable non-volatile memory module matches at least one first condition, wherein after the first word line is used, the memory controlling circuit unit continues to use the second word line if the current state of the rewritable non-volatile memory module does not match the at least one first condition.

* * * * *